US012568853B2

(12) United States Patent
Lee

(10) Patent No.: US 12,568,853 B2
(45) Date of Patent: Mar. 3, 2026

(54) DISPLAY DEVICE

(71) Applicant: Samsung Display Co., LTD., Yongin-si (KR)

(72) Inventor: Tae Hee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 386 days.

(21) Appl. No.: 17/583,810

(22) Filed: Jan. 25, 2022

(65) Prior Publication Data

US 2022/0238559 A1     Jul. 28, 2022

(30) Foreign Application Priority Data

Jan. 28, 2021     (KR) ........................ 10-2021-0012476

(51) Int. Cl.
| | |
|---|---|
| *H01L 25/16* | (2023.01) |
| *H10D 86/40* | (2025.01) |
| *H10D 86/60* | (2025.01) |
| *H10H 29/14* | (2025.01) |

(52) U.S. Cl.
CPC ......... *H01L 25/167* (2013.01); *H10D 86/441* (2025.01); *H10D 86/60* (2025.01); *H10H 29/142* (2025.01); *H01L 2224/24147* (2013.01); *H01L 2224/95145* (2013.01)

(58) Field of Classification Search
CPC .... H01L 25/167; H01L 27/156; H10H 29/142
See application file for complete search history.

(56) References Cited

U.S. PATENT DOCUMENTS

| | | | |
|---|---|---|---|
| 2014/0261613 A1 | 9/2014 | Nielson et al. | |
| 2020/0043976 A1* | 2/2020 | Kim | ...................... H01L 27/156 |
| 2020/0258938 A1 | 8/2020 | Chai et al. | |
| 2022/0069004 A1 | 3/2022 | Kang et al. | |
| 2022/0139319 A1 | 5/2022 | Oh et al. | |
| 2022/0157789 A1* | 5/2022 | Lai | ...................... H01L 25/0753 |
| 2022/0181522 A1 | 6/2022 | Moon et al. | |
| 2022/0199879 A1* | 6/2022 | Shimizu | ............... H01L 27/156 |

FOREIGN PATENT DOCUMENTS

| | | | | |
|---|---|---|---|---|
| KR | 20200063386 A | * | 6/2020 | ........... H01L 27/156 |
| KR | 10-2020-0086790 | | 7/2020 | |
| KR | 10-2020-0097869 | | 8/2020 | |
| KR | 10-2020-0105598 | | 9/2020 | |
| KR | 10-2020-0121956 | | 10/2020 | |
| KR | 10-2021-0143961 | | 11/2021 | |

OTHER PUBLICATIONS

Editors of the American Heritage Dictionaries (Ed.). (2016). Between. In the American Heritage(R) Dictionary of the English Language (6th ed.). Houghton Mifflin. (Year: 2016).*

* cited by examiner

*Primary Examiner* — Peter M Albrecht
(74) *Attorney, Agent, or Firm* — Womble Bond Dickinson (US) LLP

(57) ABSTRACT

A display device includes a substrate including a plurality of pixels, a circuit conductive layer on the substrate, a barrier metal layer on the circuit conductive layer, a first electrode and a second electrode on the barrier metal layer and spaced apart from each other, and a light emitting element between the first electrode and the second electrode, and the barrier metal layer is electrically separated from the circuit conductive layer.

17 Claims, 15 Drawing Sheets

FIG. 7

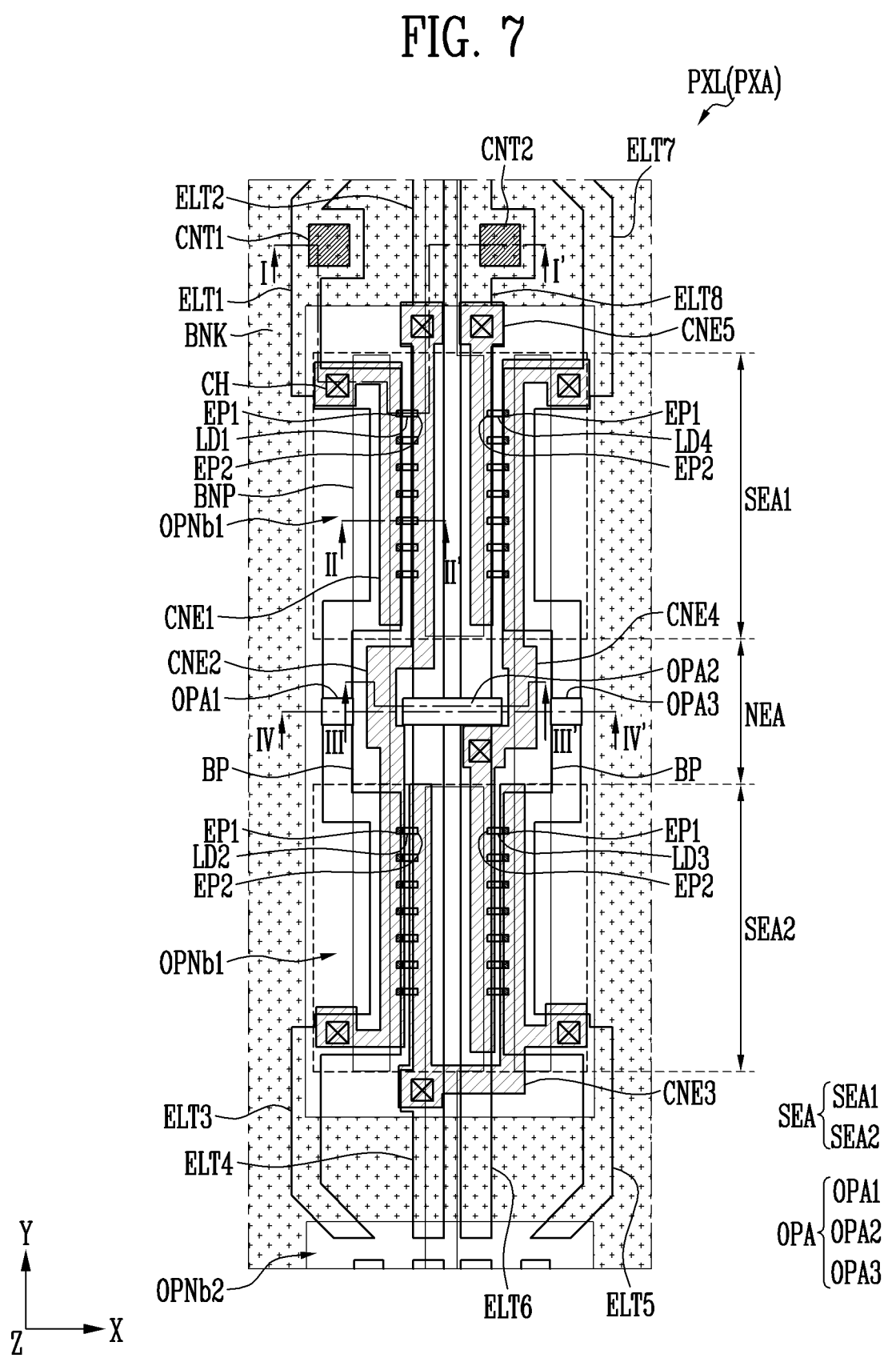

PXL(PXA)

CNT2        ELT7

ELT2
CNT1
ELT1        ELT8
BNK         CNE5
CH
EP1         EP1
LD1         LD4
EP2         EP2
BNP
OPNb1
                SEA1
CNE1        CNE4
CNE2        OPA2
OPA1        OPA3
                NEA
BP          BP
EP1         EP1
LD2         LD3
EP2         EP2
OPNb1
                SEA2
ELT3
CNE3
ELT4
                SEA { SEA1
                      SEA2
OPNb2
ELT6    ELT5
                OPA { OPA1
                      OPA2
                      OPA3

Y
Z → X

PXL(PXA)

CNT2     ELT7

ELT2
CNT1

ELT1     ELT8
BNK     CNE5

CH
EP1     EP1
LD1     LD4
EP2     EP2
BNP
OPNb1

SEA1

CNE1

CNE2     CNE4
OPA1     OPA2
OPA3

NEA

BP     BP

EP1     EP1
LD2     LD3
EP2     EP2

OPNb1

SEA2

ELT3

CNE3

ELT4

$SEA \begin{cases} SEA1 \\ SEA2 \end{cases}$ $OPA \begin{cases} OPA1 \\ OPA2 \\ OPA3 \end{cases}$ OPNb2     ELT6     ELT5

Y
Z   X

DISPLAY DEVICE

CROSS-REFERENCE TO RELATED APPLICATION

This application claims priority to and the benefit of Korean Patent Application No. 10-2021-0012476, filed on Jan. 28, 2021 in the Korean Intellectual Property Office, the entire content of which is herein incorporated by reference.

BACKGROUND

1. Field

Aspects of embodiments of the present disclosure relate to a display device.

2. Description of the Related Art

In recent years, as interest in information display is increasing, research and development for a display device are continuously being conducted.

SUMMARY

According to an aspect of embodiments of the present disclosure, a display device capable of improving an alignment degree of a light emitting element is provided.

However, aspects and objects of embodiments of the present disclosure are not limited to that described above, and other aspects and objects which are not described will be clearly understood by those skilled in the art from the following description.

According to one or more embodiments, a display device includes a substrate including a plurality of pixels, a circuit conductive layer disposed on the substrate, a barrier metal layer disposed on the circuit conductive layer, a first electrode and a second electrode disposed on the barrier metal layer and spaced apart from each other, and a light emitting element disposed between the first electrode and the second electrode. The barrier metal layer is electrically separated from the circuit conductive layer.

The circuit conductive layer may be disposed between the first electrode and the second electrode.

The barrier metal layer may be disposed between the first electrode and the second electrode.

The circuit conductive layer may overlap the light emitting element.

The barrier metal layer may overlap the light emitting element.

The display device may further include a barrier insulating layer disposed between the circuit conductive layer and the barrier metal layer.

The barrier metal layer may cover the circuit conductive layer on the barrier insulating layer.

The first electrode or the second electrode may be electrically connected to the circuit conductive layer through a contact hole passing through the barrier insulating layer.

The first electrode or the second electrode may be electrically connected to the circuit conductive layer through a contact hole passing through the barrier metal layer.

Each of the plurality of pixels may include an emission area and a non-emission area.

The display device may further include a barrier pattern disposed in the non-emission area.

The barrier pattern may include an organic insulating material.

The display device may further include a bank pattern disposed in the emission area and overlapping the first electrode and the second electrode.

The barrier pattern may include a same material as the bank pattern.

The display device may further include a bank around the emission area and the non-emission area.

The barrier pattern may include a same material as the bank.

The emission area may include a first emission area and a second emission area, and the non-emission area may be disposed between the first emission area and the second emission area.

The display device may further include an insulating layer covering the first electrode and the second electrode, and the insulating layer may include at least one opening disposed in the non-emission area.

The opening may include a first opening disposed at an end of the first electrode and a second opening disposed at an end of the second electrode.

The barrier pattern may be disposed between the first opening and the second opening.

Further details of the above and other embodiments are included in the detailed description and drawings.

According to an aspect of embodiments of the disclosure, signal interference due to the circuit conductive layer may be minimized or reduced when aligning the light emitting elements, by forming the barrier metal layer and/or the barrier pattern on the circuit conductive layer, and an alignment degree of the light emitting element may be improved.

Aspects and effects according to embodiments are not limited by those illustrated above, and more various aspects and effects are included in the present specification.

BRIEF DESCRIPTION OF THE DRAWINGS

The above and other features of the disclosure will become more apparent by describing in further detail some embodiments thereof with reference to the accompanying drawings, in which:

FIGS. 7 and 8 are plan views illustrating a pixel according to an embodiment;

DETAILED DESCRIPTION

Figure 1:
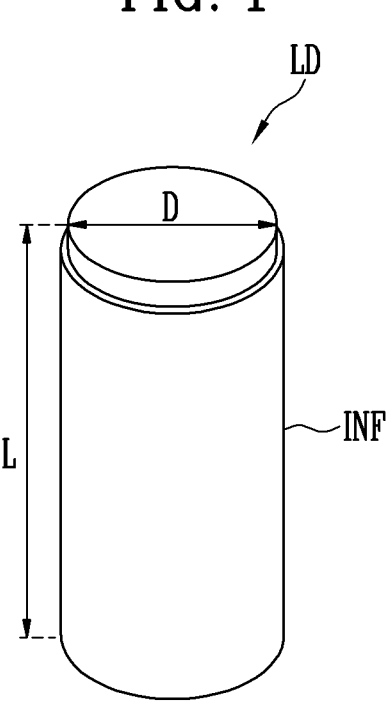
FIGS. 1 and 2 are perspective and cross-sectional views, respectively, illustrating a light emitting element according to an embodiment.

The aspects and features of the disclosure and a method of achieving them will become apparent with reference to the embodiments described in further detail below together with the accompanying drawings. However, the disclosure is not limited to the embodiments disclosed below, and may be implemented in various different forms. The present embodiments are provided so that the disclosure will be thorough and complete and those skilled in the art to which the disclosure pertains can fully understand the scope of the disclosure. The disclosure is defined by the scope of the claims.

The terms used in the present specification are for describing embodiments and are not intended to limit the disclosure. In the present specification, the singular form also includes the plural form unless otherwise specified. The terms "comprises" and/or "comprising" do not exclude presence or addition of one or more other components, steps, operations, and/or elements to the described component, step, operation, and/or element.

In addition, the term "coupling" or "connection" may collectively mean a physical and/or electrical coupling or connection. In addition, this may collectively mean a direct or indirect coupling or connection and an integral or non-integral coupling or connection.

A case in which an element or a layer is referred to as "on" another element or layer includes a case in which another layer or another element is disposed directly on the other element or between the other layers. The same reference numerals denote the same components throughout the specification.

Although "first," "second," and the like may be used to describe various components, these components are not limited by these terms. These terms are used to distinguish one component from another component. Therefore, a first component described below may be a second component within the technical spirit of the disclosure.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Herein, some embodiments of the disclosure are described in further detail with reference to the accompanying drawings.

Figure 2:
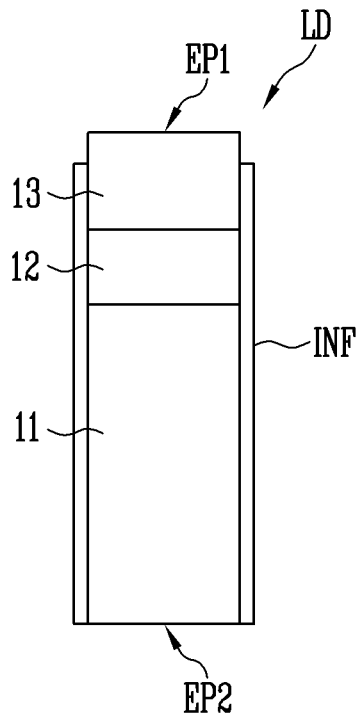

FIGS. 1 and 2 are perspective and cross-sectional views, respectively, illustrating a light emitting element according to an embodiment. FIGS. 1 and 2 show a column-shaped light emitting element LD, but a type and/or a shape of the light emitting element LD are/is not limited thereto.

Referring to FIGS. 1 and 2, the light emitting element LD may include a first semiconductor layer 11, a second semiconductor layer 13, and an active layer 12 interposed between the first and second semiconductor layers 11 and 13. For example, when an extension direction of the light emitting element LD is a length L direction, the light emitting element LD may include the first semiconductor layer 11, the active layer 12, and the second semiconductor layer 13 sequentially stacked along the length L direction.

The light emitting element LD may be provided in a column shape extending along a direction. The light emitting element LD may have a first end portion EP1 and a second end portion EP2. One of the first and second semiconductor layers 11 and 13 may be disposed at the first end portion EP1 of the light emitting element LD. The other of the first and second semiconductor layers 11 and 13 may be disposed at the second end portion EP2 of the light emitting element LD.

According to an embodiment, the light emitting element LD may be a light emitting element manufactured in a column shape through an etching method or the like. In the present specification, the column shape includes a rod-like shape or a bar-like shape that is long in the length L direction (that is, an aspect ratio is greater than 1), such as a circular column or a polygonal column, and the shape of the cross-section thereof is not particularly limited. For example, the length L of the light emitting element LD may be greater than a diameter D (or a width of a cross-section).

In an embodiment, the light emitting element LD may have a size as small as a nanometer scale to a micrometer scale. For example, each light emitting element LD may have the diameter D (or width) and/or the length L of a nanometer scale to micrometer scale range. However, a size of the light emitting element LD is not limited thereto, and the size of the light emitting element LD may be variously changed according to a design condition of various devices using a light emitting device using the light emitting element LD as a light source, for example, a display device.

The first semiconductor layer 11 may be a semiconductor layer of a first conductivity type. For example, the first semiconductor layer 11 may include an n-type semiconductor layer. For example, the first semiconductor layer 11 may include any of InAlGaN, GaN, AlGaN, InGaN, AlN, and InN, and may include an n-type semiconductor layer doped with a first conductivity type dopant, such as any of Si, Ge, and Sn. However, the material configuring the first semiconductor layer 11 is not limited thereto, and the first semiconductor layer 11 may be formed of various other materials.

The active layer 12 may be disposed on the first semiconductor layer 11 and may be formed in a single quantum well or multi-quantum well structure. A position of the active layer 12 may be variously changed according to the type of the light emitting element LD.

In an embodiment, a clad layer (not shown) doped with a conductive dopant may be formed on and/or under the active layer 12. For example, the clad layer may be formed of AlGaN or InAlGaN. According to an embodiment, a material of AlGaN, InAlGaN, or the like may be used to form the active layer 12, and various other materials may configure the active layer 12.

The second semiconductor layer 13 may be disposed on the active layer 12 and may include a semiconductor layer of a type different from that of the first semiconductor layer 11. For example, the second semiconductor layer 13 may include a p-type semiconductor layer. For example, the second semiconductor layer 13 may include at least one semiconductor material among InAlGaN, GaN, AlGaN, InGaN, AlN, and InN, and may include a p-type semiconductor layer doped with a second conductivity type dopant, such as Mg. However, the material configuring the second semiconductor layer 13 is not limited thereto, and various other materials may configure the second semiconductor layer 13.

When a voltage equal to or greater than a threshold voltage is applied to both ends of the light emitting element LD, an electron-hole pair is combined in the active layer 12 and, thus, the light emitting element LD emits light. By controlling light emission of the light emitting element LD using such a principle, the light emitting element LD may be used as a light source of various light emitting devices including a pixel of a display device.

The light emitting element LD may further include an insulating film INF provided on a surface. The insulating film INF may be formed on the surface of the light emitting element LD to surround an outer circumferential surface of at least the active layer 12, and may further surround a region of the first and second semiconductor layers 11 and 13.

According to an embodiment, the insulating film INF may expose both ends of the light emitting element LD having different polarities. For example, the insulating film INF may expose an end of each of the first and second semiconductor layers 11 and 13 positioned at the first and second end portions EP1 and EP2 of the light emitting element LD. In another embodiment, the insulating film INF may expose a side portion of the first and second semiconductor layers 11 and 13 adjacent to the first and second end portions EP1 and EP2 of the light emitting element LD having different polarities.

According to an embodiment, the insulating film INF may include at least one insulating material among silicon oxide (SiOx), silicon nitride (SiNx), silicon oxynitride (SiOxNy), aluminum oxide (AlOx), and titanium oxide (TiOx), and may be configured of a single layer or multiple layers (for example, a double layer configured of aluminum oxide (AlOx) and silicon oxide (SiOx)), but is not limited thereto. According to an embodiment, the insulating film INF may be omitted.

When the insulating film INF is provided to cover a surface of the light emitting element LD, in particular, an outer circumferential surface of the active layer 12, a short between the active layer 12 and a first pixel electrode, a second pixel electrode, or the like to be described later may be prevented or substantially prevented. Accordingly, electrical stability of the light emitting element LD may be secured.

In addition, when the insulating film INF is provided on the surface of the light emitting element LD, a surface defect of the light emitting element LD may be minimized or reduced, thereby improving life and efficiency. In addition, in a case in which a plurality of light emitting elements LD are disposed in close contact with each other, an unwanted short circuit between the light emitting elements LD may be prevented or substantially prevented.

In an embodiment, the light emitting element LD may further include an additional component in addition to the first semiconductor layer 11, the active layer 12, the second semiconductor layer 13, and/or the insulating film INF. For example, the light emitting element LD may further include at least one phosphor layer, an active layer, a semiconductor layer, and/or an electrode layer disposed on an end side of the first semiconductor layer 11, the active layer 12, and/or the second semiconductor layer 13. For example, a contact electrode layer may be disposed at each of the first and second end portions EP1 and EP2. Meanwhile, although the column shape light emitting element LD is shown in FIGS. 1 and 2, the type, structure, and/or shape of the light emitting element LD may be variously changed. For example, the light emitting element LD may be formed in a core-shell structure having a polygonal cone shape.

A light emitting device including the light emitting element LD described above may be used in various types of devices that require a light source, including a display device. For example, a plurality of light emitting elements LD may be disposed in each pixel of a display panel, and the light emitting elements LD may be used as a light source of each pixel. However, an application field of the light emitting element LD is not limited to the above-described example. For example, the light emitting element LD may also be used in other types of devices that require a light source, such as a lighting device.

Figure 3:
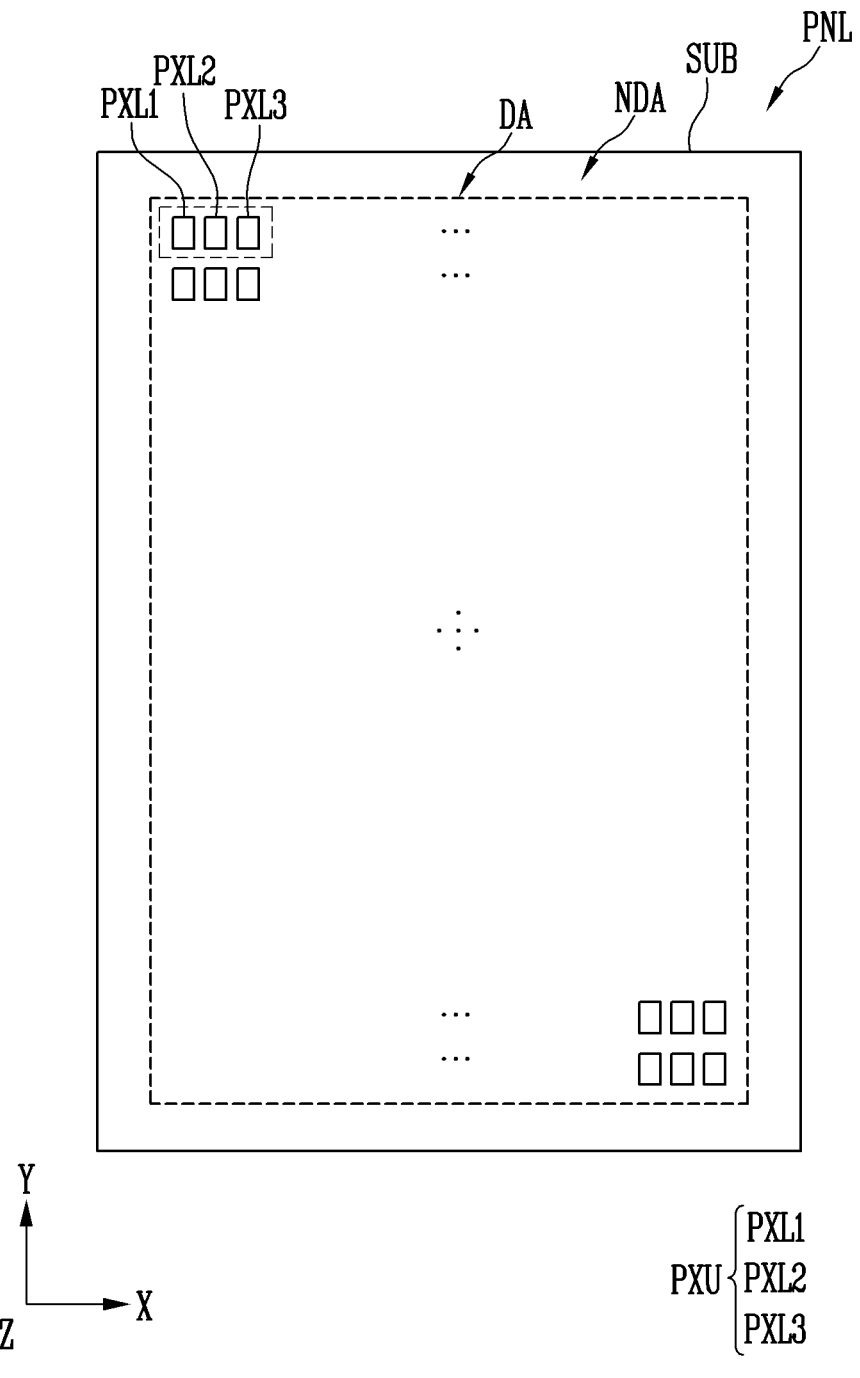
FIG. 3 is a plan view illustrating a display device according to an embodiment.

FIG. 3 is a plan view illustrating a display device according to an embodiment.

In FIG. 3, as an example of an electronic device that may use the light emitting element LD described in the embodiments of FIGS. 1 and 2 as a light source, a display device, in particular, a display panel PNL provided in the display device is shown.

Each pixel unit PXU of the display panel PNL and each pixel configuring each pixel unit PXU may include at least one light emitting element LD. For convenience, in FIG. 3, a structure of the display panel PNL is briefly shown based on a display area DA. However, according to an embodiment, at least one driving circuit unit (for example, at least one of a scan driver and a data driver), lines, and/or pads, which are not shown, may be further disposed on the display panel PNL.

Referring to FIG. 3, the display panel PNL may include a substrate SUB and a pixel unit PXU disposed on the substrate SUB. The pixel unit PXU may include at least one of first pixels PXL1, second pixels PXL2, and/or third pixels PXL3. Herein, when at least one pixel among the first pixels PXL1, the second pixels PXL2, and the third pixels PXL3 is arbitrarily referred to, or when two or more types of pixels are collectively referred to, at least one or two or more types of pixels may be referred to as a "pixel PXL" or "pixels PXL."

The substrate SUB may be configured as a base member of the display panel PNL, and may be a rigid or flexible substrate or film. For example, the substrate SUB may be a rigid substrate formed of glass or tempered glass, a flexible substrate (or a thin film) formed of plastic or metal, or an insulating layer of at least one layer. However, the material and/or a material property of the substrate SUB are not particularly limited.

In an embodiment, the substrate SUB may be substantially transparent. Here, "substantially transparent" means that light may be transmitted at a certain transmittance (e.g., a predetermined transmittance) or more. In another embodiment, the substrate SUB may be translucent or opaque. In an embodiment, the substrate SUB may include a reflective material.

The display panel PNL and the substrate SUB for forming the display panel PNL may include the display area DA for displaying an image and a non-display area NDA except for the display area DA.

The pixels PXL may be disposed in the display area DA. Various lines, pads, and/or a built-in circuit unit connected to the pixels PXL of the display area DA may be disposed in the non-display area NDA. The pixels PXL may be regularly arranged according to a stripe or PENTILE™ arrangement structure, or the like. However, the arrangement structure of the pixels PXL is not limited thereto, and the pixels PXL may be arranged in the display area DA in various structures and/or methods.

According to an embodiment, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged. At least one of the first to third pixels PXL1, PXL2, and PXL3 arranged to be adjacent to each other may configure one pixel unit PXU capable of emitting light of various colors. For example, each of the first to third pixels PXL1, PXL2, and PXL3 may be a sub pixel emitting light of a certain color (e.g., a predetermined color). According to an embodiment, the first pixel PXL1 may be a red pixel emitting red light, the second pixel PXL2 may be a green pixel emitting green light, and the third pixel PXL3 may be a blue pixel emitting blue light, but are not limited thereto.

In an embodiment, the first pixel PXL1, the second pixel PXL2, and the third pixel PXL3 may include a light emitting element of the first color, a light emitting element of the second color, and a light emitting element of the third color as a light source, to emit light of the first color, the second color, and the third color, respectively. In another embodiment, the first pixel PXL1, the second pixel PXL2, and the third pixel PXL3 may include light emitting elements that emit light of a same color, and may include a color conversion layer and/or a color filter of different colors disposed on the respective light emitting element, to emit light of the first color, the second color, and the third color, respectively. However, the color, type, number, and/or the like of pixels PXL configuring each pixel unit PXU are not particularly limited. That is, the color of light emitted by each pixel PXL may be variously changed.

The pixel PXL may include at least one light source driven by a control signal (e.g., a predetermined control signal) (for example, a scan signal and a data signal) and/or power (e.g., predetermined power) (for example, first power and second power). In an embodiment, the light source may include at least one light emitting element LD according to any of the embodiments of FIGS. 1 and 2, for example, an ultra-small column shape light emitting elements LD having a size as small as a nanometer scale to a micrometer scale. However, the disclosure is not limited thereto, and various types of light emitting elements LD may be used as the light source of the pixel PXL.

In an embodiment, each pixel PXL may be configured as an active pixel. However, a type, a structure, and/or a driving method of the pixels PXL applicable to the display device are not particularly limited. For example, each pixel PXL may be configured as a pixel of a passive or active light emitting display device of various structures and/or driving methods.

Figure 4:
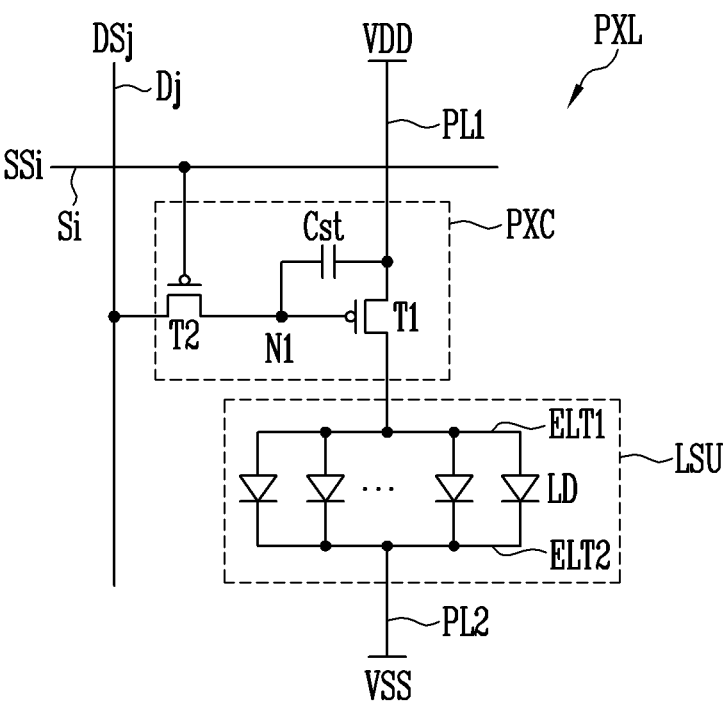
FIGS. 4 to 6 are circuit diagrams illustrating a pixel according to an embodiment.
Figure 5:
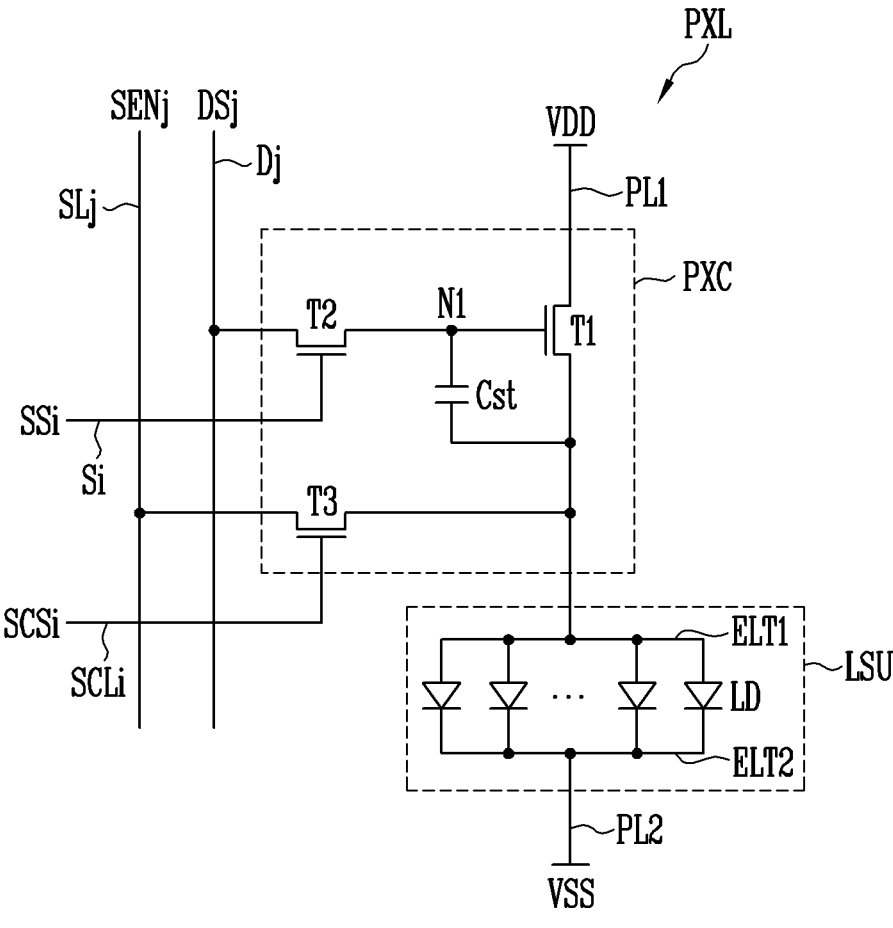
Figure 6:
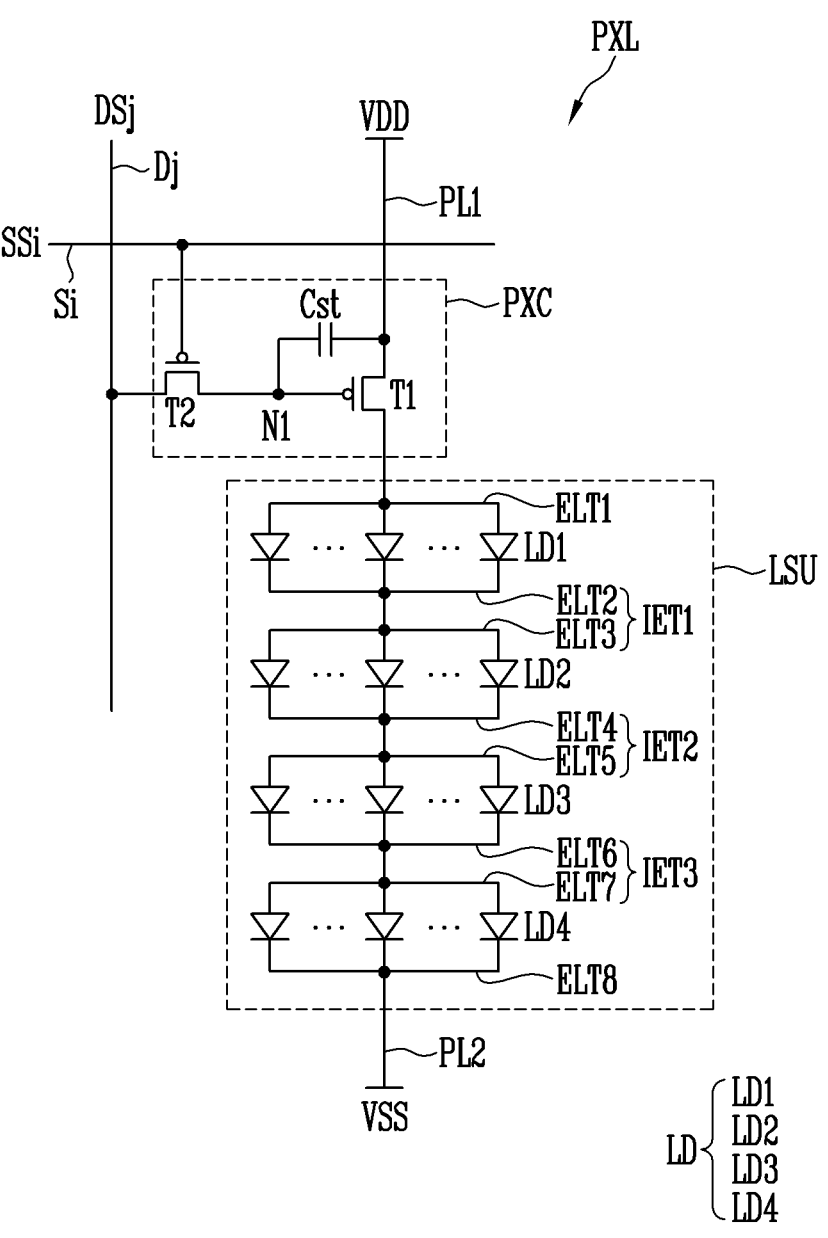

FIGS. 4 to 6 are circuit diagrams illustrating a pixel according to an embodiment. For example, FIGS. 4 to 6 illustrate an embodiment of the pixel PXL applicable to an active display device. However, types of the pixel PXL and the display device are not limited thereto.

According to an embodiment, the pixel PXL shown in FIGS. 4 to 6 may be any of the first pixel PXL1, the second pixel PXL2, and the third pixel PXL3 provided in the display panel PNL of FIG. 3. In an embodiment, the first pixel PXL1, the second pixel PXL2, and the third pixel PXL3 may have a structure substantially the same as or similar to each other.

Referring to FIG. 4, the pixel PXL may include a light source unit LSU for generating light having a luminance corresponding to a data signal, and a pixel circuit PXC for driving the light source unit LSU.

The light source unit LSU may include at least one light emitting element LD electrically connected between first power VDD and second power VSS. For example, the light source unit LSU may include a first electrode ELT1 (also referred to as a "first pixel electrode" or a "first alignment electrode") electrically connected to the first power VDD via the pixel circuit PXC and a first power line PL1, a second electrode ELT2 (also referred to as a "second pixel electrode" or a "second alignment electrode") electrically connected to the second power VSS through a second power line PL2, and a plurality of light emitting elements LD electrically connected in a same direction between the first and second electrodes ELT1 and ELT2. In an embodiment, the first electrode ELT1 may be an anode electrode, and the second electrode ELT2 may be a cathode electrode.

Each of the light emitting elements LD may include a first end portion (for example, a p-type end portion) electrically connected to the first power VDD through the first electrode ELT1 and/or the pixel circuit PXC, and a second end portion (for example, an n-type end portion) electrically connected to the second power VSS through the second electrode ELT2. That is, the light emitting elements LD may be connected in parallel in a forward direction between the first and second electrodes ELT1 and ELT2. Each light emitting element LD connected in the forward direction between the first power VDD and the second power VSS may configure each effective light source, and the effective light sources may be gathered to configure the light source unit LSU of the pixel PXL.

The first power VDD and the second power VSS may have different potentials such that the light emitting elements LD may emit light. For example, the first power VDD may be set as high potential power, and the second power VSS may be set as low potential power. At this time, a potential difference between the first power VDD and the second power VSS may be set to be equal to or greater than a threshold voltage of the light emitting elements LD during an emission period of the pixel PXL.

A first end portion (for example, the p-type end portion) of the light emitting elements LD configuring each light source unit LSU may be commonly connected to the pixel circuit PXC through an electrode (for example, the first electrode ELT1 of each pixel PXL) of the light source unit LSU, and may be electrically connected to the first power VDD through the pixel circuit PXC and the first power line PL1. A second end portion (for example, the n-type end portion) of the light emitting elements LD may be commonly connected to the second power VSS through another electrode (for example, the second electrode ELT2 of each pixel PXL) of the light source unit LSU and the second power line PL2.

The light emitting elements LD may emit light at a luminance corresponding to a driving current supplied through the pixel circuit PXC. For example, during each frame period, the pixel circuit PXC may supply a driving current corresponding to a grayscale value to be expressed in a corresponding frame to the light source unit LSU. The driving current supplied to the light source unit LSU may be divided and flow to the light emitting elements LD connected in the forward direction. Accordingly, while each light emitting element LD emits light at a luminance corresponding to the current flowing therethrough, the light source unit LSU may emit light of the luminance corresponding to the driving current.

The pixel circuit PXC may be electrically connected between the first power VDD and the first electrode ELT1. The pixel circuit PXC may be electrically connected to a scan line Si and a data line Dj of a corresponding pixel PXL. For example, when the pixel PXL is disposed on an i-th (i is a natural number) horizontal line (row) and a j-th (j is a natural number) vertical line (column) of the display area DA, the pixel circuit PXC of the pixel PXL may be electrically connected to an i-th scan line Si and a j-th data line Dj of the display area DA.

According to an embodiment, the pixel circuit PXC may include a plurality of transistors and at least one capacitor.

For example, the pixel circuit PXC may include a first transistor T1, a second transistor T2, and a storage capacitor Cst.

The first transistor T1 is electrically connected between the first power VDD and the light source unit LSU. For example, a first electrode (for example, a source electrode) of the first transistor T1 may be electrically connected to the first power VDD, and a second electrode (for example, a drain electrode) of the first transistor T1 may be electrically connected to the first electrode ELT1. A gate electrode of the first transistor T1 is electrically connected to a first node N1. The first transistor T1 controls the driving current supplied to the light source unit LSU in correspondence with a voltage of the first node N1. That is, the first transistor T1 may be a driving transistor that controls the driving current of the pixel PXL.

The second transistor T2 is electrically connected between the data line Dj and the first node N1. For example, a first electrode (for example, a source electrode) of the second transistor T2 may be electrically connected to the data line Dj, and a second electrode (for example, a drain electrode) of the second transistor T2 may be electrically connected to the first node N1. A gate electrode of the second transistor T2 is electrically connected to the scan line Si. The second transistor T2 may be turned on when a scan signal SSi of a gate-on voltage (for example, a low level voltage) is supplied from the scan line Si, to electrically connect the data line Dj and the first node N1.

In each frame period, a data signal DSj of a corresponding frame is supplied to the data line Dj, and the data signal DSj is transferred to the first node N1 through the second transistor T2 which is turned on during a period in which the scan signal SSi of the gate-on voltage is supplied. That is, the second transistor T2 may be a switching transistor for transferring each data signal DSj to an inside of the pixel PXL.

One electrode of the storage capacitor Cst is electrically connected to the first power VDD, and another electrode is electrically connected to the first node N1. The storage capacitor Cst charges a voltage corresponding to the data signal DSj supplied to the first node N1 during each frame period.

In an embodiment, in FIG. 4, all transistors included in the pixel circuit PXC, for example, the first and second transistors T1 and T2 are p-type transistors, but are not limited thereto, and at least one of the first and second transistors T1 and T2 may be an n-type transistor. In addition, the pixel circuit PXC may be configured with a pixel circuit of various structures and/or driving methods.

Referring to FIG. 5, in an embodiment, the pixel circuit PXC may be further connected to a sensing control line SCLi and a sensing line SLj. For example, the pixel circuit PXC of the pixel PXL disposed on the i-th horizontal line and the j-th vertical line of the display area DA may be electrically connected to an i-th sensing control line SCLi and a j-th sensing line SLj of the display area DA. The pixel circuit PXC may further include a third transistor T3. In another embodiment, the sensing line SLj may be omitted, and a characteristic of the pixel PXL may be detected by detecting a sensing signal SENj through the data line Dj of a corresponding pixel PXL (or an adjacent pixel).

The third transistor T3 is electrically connected between the first transistor T1 and the sensing line SLj. For example, one electrode of the third transistor T3 may be electrically connected to the one electrode (for example, the source electrode) of the first transistor T1 connected to the first electrode ELT1, and another electrode of the third transistor T3 may be electrically connected to the sensing line SLj. In an embodiment, when the sensing line SLj is omitted, the other electrode of the third transistor T3 may be electrically connected to the data line Dj.

A gate electrode of the third transistor T3 is connected to the sensing control line SCLi. In an embodiment, when the sensing control line SCLi is omitted, the gate electrode of the third transistor T3 may be connected to the scan line Si. The third transistor T3 is turned on by a sensing control signal SCSi of a gate-on voltage (for example, a high level voltage) supplied to the sensing control line SCLi during a sensing period (e.g., a predetermined sensing period), to electrically connect the sensing line SLj and the first transistor T1.

According to an embodiment, the sensing period may be a period for extracting the characteristic (for example, a threshold voltage or the like of the first transistor T1) of each of the pixels PXL disposed in the display area DA. During the sensing period, the first transistor T1 may be turned on by supplying a reference voltage (e.g., a predetermined reference voltage) that may turn on the first transistor T1 to the first node N1 through the data line Dj and the second transistor T2 or connecting each pixel PXL to a current source or the like. In addition, the first transistor T1 may be electrically connected to the sensing line SLj by turning on the third transistor T3 by supplying the sensing control signal SCSi of the gate-on voltage to the third transistor T3. Thereafter, the sensing signal SENj may be obtained through the sensing line SLj, and the characteristic of each pixel PXL, including the threshold voltage of the first transistor T1, may be detected using the sensing signal SENj. Information of the characteristic of each pixel PXL may be used to convert image data such that a characteristic deviation between the pixels PXL disposed in the display area DA may be compensated.

Meanwhile, in FIG. 5, an embodiment in which all of the first, second, and third transistors T1, T2, and T3 are n-type transistors is disclosed, but is not limited thereto. For example, at least one of the first, second, and third transistors T1, T2, and T3 may be a p-type transistor.

In addition, FIGS. 4 and 5 show an embodiment in which all effective light sources configuring each light source unit LSU, that is, the light emitting elements LD, are connected in parallel, but embodiments are not limited thereto. For example, as shown in FIG. 6, the light source unit LSU of each pixel PXL may be configured to include a series structure. In describing the embodiment of FIG. 6, a further detailed description of a configuration (for example, the pixel circuit PXC) similar to or the same as that of the embodiments of FIGS. 4 and 5 may be omitted.

Referring to FIG. 6, the light source unit LSU may include light emitting elements LD divided into at least four serial stages and connected in series/parallel to each other. In this case, each serial stage may include a pair of electrodes (for example, two electrodes) and at least one light emitting element LD electrically connected between the pair of electrodes. Here, the number of light emitting elements LD configuring each serial stage may be the same or different from each other, and the number of light emitting elements LD is not particularly limited. For example, a first serial stage may include a first electrode ELT1, a second electrode ELT2, and at least one first light emitting element LD1 electrically connected between the first electrode ELT1 and the second electrode ELT2, and a second serial stage may include a third electrode ELT3, a fourth electrode ELT4, and at least one second light emitting element LD2 electrically connected between the third electrode ELT3 and the fourth electrode ELT4. Similarly, a third serial stage may include a fifth electrode ELT5, a sixth electrode ELT6, and at least one third light emitting element LD3 electrically connected between the fifth electrode ELT5 and the sixth electrode ELT6, and a fourth serial stage may include a seventh electrode ELT7, an eighth electrode ELT8, and at least one fourth light emitting element LD4 electrically connected between the seventh electrode ELT7 and the eighth electrode ELT8.

A first electrode of the light source unit LSU, for example, the first electrode ELT1 may be a first pixel electrode (or an anode electrode) of the light source unit LSU. In addition, a last electrode of the light source unit LSU, for example, the eighth electrode ELT8 may be a second pixel electrode (or a cathode electrode) of the light source unit LSU.

Remaining electrodes of the light source unit LSU, for example, the second to seventh electrodes ELT2 to ELT7 may configure each intermediate electrode. For example, the second electrode ELT2 and the third electrode ELT3 may be integrally or non-integrally connected to each other to configure a first intermediate electrode IET1. Similarly, the fourth electrode ELT4 and the fifth electrode ELT5 may be integrally or non-integrally connected to each other to configure a second intermediate electrode IET2, and the sixth electrode ELT6 and the seventh electrode ELT7 may be integrally or non-integrally connected to each other to configure a third intermediate electrode IET3. In this case, the second and third electrodes ELT2 and ELT3 may be integrated to be regarded as one first intermediate electrode IET1, the fourth and fifth electrodes ELT4 and ELT5 may be integrated to be regarded as one second intermediate electrode IET2, and the sixth and seventh electrodes ELT6 and ELT7 may be integrated to be regarded as one third intermediate electrode IET3.

When configuring the light source unit LSU by utilizing the light emitting elements LD of the same condition (for example, the same size and/or number) as an effective light source, in a case in which the light emitting elements LD are connected in a series or series/parallel mixed structure, power efficiency may be improved. For example, in the light source unit LSU in which the light emitting elements LD are connected in series or in series/parallel, a higher luminance may be expressed with the same current compared to the light source unit LSU in which the light emitting elements LD are connected only in parallel. In addition, in the light source unit LSU in which the light emitting elements LD are connected in series or in series/parallel, the same luminance may be expressed with a lower driving current compared to the light source unit LSU in which the light emitting elements LD are connected in parallel. In addition, in the pixel PXL in which the light emitting elements LD are connected in the series or series/parallel mixed structure, even though a short defect may occur at some of the serial stages, since some degree of luminance may be expressed through the light emitting elements LD of the remaining serial stages, a possibility of a dark spot defect of the pixel PXL may be reduced.

Figure 8:
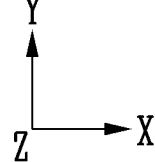

FIGS. 7 and 8 are plan views illustrating a pixel according to an embodiment.

For example, FIGS. 7 and 8 may be any of the first to third pixels PXL1, PXL2, and PXL3 configuring the pixel unit PXU of FIG. 3, and the first to third pixels PXL1, PXL2, and PXL3 may have substantially a same or similar structure to each other. In addition, FIGS. 7 and 8 disclose an embodiment in which each pixel PXL includes the light emitting elements LD disposed at four serial stages, as shown in FIG.

6, but the number of serial stages of each pixel PXL may be variously changed according to embodiments.

Herein, when one or more of the first to fourth light emitting elements LD1 to LD4 are arbitrarily referred to, or when two or more types of light emitting elements are collectively referred to, the one or more of the first to fourth light emitting elements LD1 to LD4 or the two or more types of light emitting elements are referred to as a "light emitting element LD" or the "light emitting elements LD." In addition, when at least one of the pixel electrodes including the first to eighth electrodes ELT1 to ELT8 is arbitrary referred to, the at least one of the pixel electrodes including the first to eighth electrodes ELT1 to ELT8 is referred to as a "pixel electrode ELT" or "pixel electrodes ELT," and when at least one of the contact electrodes including first to fifth contact electrodes CNE1 to CNE5 is arbitrarily referred to, the at least one of the contact electrodes including the first to fifth contact electrodes CNE1 to CNE5 is referred to as a "contact electrode CNE" or "contact electrodes CNE."

Referring to FIGS. 7 and 8, the pixel PXL may include an emission area SEA and a non-emission area NEA. In an embodiment, the emission area SEA may include a first emission area SEA1 and a second emission area SEA2 spaced apart from each other. The first emission area SEA1 and the second emission area SEA2 may be disposed to be spaced apart from each other in a second direction (Y-axis direction) within a pixel area PXA. The non-emission area NEA may be disposed between the first emission area SEA1 and the second emission area SEA2.

The emission area SEA may include at least one light emitting element LD and electrodes electrically connected to the at least one light emitting element LD. In an embodiment, when the pixel PXL includes the plurality of light emitting elements LD divided into the plurality of serial stages and disposed, as in the embodiment shown in FIG. 6, each of the first and second emission areas SEA1 and SEA2 may include the light emitting element LD disposed at at least one serial stage and the electrodes electrically connected to the light emitting element LD. For example, the first emission area SEA1 may include the first light emitting elements LD1 disposed at the first serial stage of the corresponding pixel PXL and a plurality of electrodes connected to the first light emitting elements LD1, and the second emission area SEA2 may include the second light emitting elements LD2 disposed at the second serial stage and a plurality of electrodes connected to the second light emitting elements LD2. In this case, the first light emitting element LD1 disposed in the first emission area SEA1 and the second light emitting element LD2 disposed in the second emission area SEA2 may be connected in series to each other. For example, the first light emitting element LD1 and the second light emitting element LD2 may be connected in series to each other by at least one contact electrode CNE.

In addition, when it is assumed that each pixel PXL includes serial stages of a number greater than a number of the emission areas SEA, each of the emission areas SEA may include the light emitting elements LD disposed at two or more serial stages and electrodes electrically connected to the light emitting elements LD. For example, the first emission area SEA1 may include the light emitting elements LD1 and LD4 and the electrodes disposed at the first and fourth serial stages of the light source unit LSU, and the second emission area SEA2 may include the light emitting elements LD2 and LD3 and the electrodes disposed at the second and third serial stages.

The pixel PXL may include the first electrode ELT1, the second electrode ELT2, and at least one first light emitting element LD1 electrically connected between the first and second electrodes ELT1 and ELT2 disposed in the first emission area SEA1, and the third electrode ELT3, the fourth electrode ELT4, and at least one second light emitting element LD2 electrically connected between the third and fourth electrodes ELT3 and ELT4 disposed in the second emission area SEA2. In addition, the pixel PXL may include the fifth electrode ELT5, the sixth electrode ELT6, and at least one third light emitting element LD3 electrically connected between the fifth and sixth electrodes ELT5 and ELT6 disposed in the second emission area SEA2, and the seventh electrode ELT7, the eighth electrode ELT8, and at least one fourth light emitting element LD4 electrically connected between the seventh and eighth electrodes ELT7 and ELT8 disposed in the first emission area SEA1.

FIGS. 7 and 8 show a case in which the fifth electrode ELT5, the sixth electrode ELT6, and the third light emitting element LD3 are disposed in the second emission area SEA2, and the seventh electrode ELT7, the eighth electrode ELT8, and the fourth light emitting element LD4 are disposed in the first emission area SEA1; however, the disclosure is not limited thereto. That is, in another embodiment, the fifth electrode ELT5, the sixth electrode ELT6, and the third light emitting element LD3 may be disposed in the first emission area SEA1, and the seventh electrode ELT7, the eighth electrode ELT8, and the fourth light emitting element LD4 may be disposed in the second emission area SEA2.

In each emission area SEA, each of the first to eighth electrodes ELT1 to ELT8 may extend along the second direction (Y-axis direction). For example, each of the first electrode ELT1, the second electrode ELT2, the seventh electrode ELT7, and/or the eighth electrode ELT8 may extend along the second direction (Y-axis) in the first emission area SEA1, and may be sequentially spaced apart along a first direction (X-axis direction). In addition, each of the third electrode ELT3, the fourth electrode ELT4, the fifth electrode ELT5, and/or the sixth electrode ELT6 may extend along the second direction (Y-axis direction) in the second emission area SEA2, and may be sequentially spaced apart along the first direction (X-axis direction). In addition, the first to eighth electrodes ELT1 to ELT8 may have a uniform width or a non-uniform width, and may or may not include a bent portion. That is, a shape and/or a mutual disposition structure of each of the first to eighth electrodes ELT1 to ELT8 may be variously changed according to embodiments.

The first to eighth electrodes ELT1 to ELT8 may configure the pixel electrodes ELT of each pixel PXL. Each of the first to eighth electrodes ELT1 to ELT8 may receive a first alignment signal (or a first alignment voltage) and a second alignment signal (or a second alignment voltage) in an alignment step of the light emitting elements LD. Accordingly, an electric field may be formed between the adjacent first to eighth electrodes ELT1 to ELT8, and, thus, the light emitting elements LD supplied to the emission area SEA may be self-aligned between the first to eighth electrodes ELT1 to ELT8.

When circuit conductive layers CP1 and CP2 (see FIG. 11) are present under the first to eighth electrodes ELT1 to ELT8, the light emitting elements LD may be abnormally aligned due to signal interference of the circuit conductive layers CP1 and CP2 in a process of aligning the light emitting elements LD. Accordingly, the display device according to an embodiment may block the signal interference due to the circuit conductive layers CP1 and CP2 by forming a barrier metal layer BML (see FIG. 11) on the circuit conductive layers CP1 and CP2, thereby improving an alignment degree of the light emitting element LD. A further detailed description thereof is provided later with reference to FIG. 11.

In an embodiment, after some of the first to eighth electrodes ELT1 to ELT8 may be first formed as one alignment line, some of the first to eighth electrodes ELT1 to ELT8 may be divided between adjacent pixels PXL and/or in the non-emission area NEA between the first and second emission areas SEA1 and SEA2, and may be divided into the pixel electrode ELT of each serial stage.

When each of alignment lines is divided in the non-emission area NEA, an end of the first to eighth electrodes ELT1 to ELT8 may partially extend to the non-emission area NEA, but is not limited thereto.

The non-emission area NEA may provide a space for dividing each of the alignment lines into the plurality of pixel electrodes ELT after the light emitting elements LD are aligned, or connecting between the pixel electrodes ELT through at least one contact electrode CNE.

The non-emission area NEA may include an opening OPA for dividing the alignment line into the plurality of pixel electrodes ELT. In an embodiment, the opening OPA may include first to third openings OPA1 to OPA3 spaced apart from each other. The first to third openings OPA1 to OPA3 may be disposed along the first direction (X-axis direction) within the non-emission area NEA.

The first opening OPA1 may be disposed between the first electrode ELT1 and the third electrode ELT3. That is, the first electrode ELT1 and the third electrode ELT3 may be spaced apart from each other with the first opening OPA1 interposed therebetween. A width of the first opening OPA1 in the first direction (X-axis direction) may be greater than a width of each of the first electrode ELT1 and/or the third electrode ELT3 in the first direction (X-axis direction), but is not limited thereto.

The second opening OPA2 may be disposed between the second electrode ELT2 and the fourth electrode ELT4 and between the eighth electrode ELT8 and the sixth electrode ELT6. That is, the second electrode ELT2 and the fourth electrode ELT4 may be spaced apart from each other with the second opening OPA2 interposed therebetween. In addition, the sixth electrode ELT6 and the eighth electrode ELT8 may be spaced apart from each other with the second opening OPA2 interposed therebetween. A width of the second opening OPA2 in the first direction (X-axis direction) may be greater than a width of the first direction (X-axis direction) from one side of the second electrode ELT2 to the other side of the eighth electrode ELT8. Similarly, the width of the second opening OPA2 in the first direction (X-axis direction) may be greater than a width of the first direction (X-axis direction) from one side of the fourth electrode ELT4 to the other side of the sixth electrode ELT6, but is not limited thereto.

The third opening OPA3 may be disposed between the fifth electrode ELT5 and the seventh electrode ELT7. The fifth electrode ELT5 and the seventh electrode ELT7 may be spaced apart from each other with the third opening OPA3 interposed therebetween. A width of the third opening OPA3 in the first direction (X-axis direction) may be greater than a width of each of the fifth electrode ELT5 and/or the seventh electrode ELT7 in the first direction (X-axis direction), but is not limited thereto.

In an embodiment, the first to third openings OPA1 to OPA3 may have different sizes. For example, the first opening OPA1 may be formed to overlap one alignment line, the second opening OPA2 may be formed to overlap a plurality of alignment lines, and the third opening OPA3 may be formed to overlap one alignment line. That is, in an embodiment, the width of the second opening OPA2 in the first direction (X-axis direction) may be greater than the width of the first opening OPA1 and/or the third opening OPA3 in the first direction (X-axis direction).

FIGS. 7 and 8 illustrate a case in which the opening OPA includes the first to third openings OPA1 to OPA3 spaced apart from each other, but the disclosure is not limited thereto. For example, the opening OPA may be configured as one opening and may extend in the first direction (X-axis direction) within the non-emission area NEA. That is, the opening OPA may extend from one side of the first electrode ELT1 to another side of the seventh electrode ELT7. In addition, the opening OPA may extend from one side of the third electrode ELT3 to another side of the fifth electrode ELT5.

Any of the above-described pixel electrodes ELT, for example, the first electrode ELT1 may be electrically connected to the pixel circuit PXC and/or the first power line PL1 through a first contact portion CNT1. Another of the pixel electrodes ELT, for example, the eighth electrode ELT8 may be electrically connected to the second power line PL2 through a second contact portion CNT2.

In an embodiment, a bank pattern BNP may be disposed under an area of each of the first to eighth electrodes ELT1 to ELT8. In this case, an area of each of the first to eighth electrodes ELT1 to ELT8 may protrude upward (for example, in a third direction (Z-axis direction)) by the bank pattern BNP, and a reflective partition wall may be formed around the light emitting elements LD. Accordingly, light efficiency of the pixel PXL may be improved. Each bank pattern BNP may be formed to overlap one pixel electrode ELT or may be formed to overlap the plurality of pixel electrodes ELT.

According to an embodiment, the first to eighth electrodes ELT1 to ELT8 may be in direct contact with and connected to the light emitting elements LD of each serial stage, or may be electrically connected to the light emitting elements LD through a separate contact electrode CNE. For example, the first to eighth electrodes ELT1 to ELT8 may be insulated from the first end portion EP1 or the second end portion EP2 of the light emitting elements LD by a first insulating layer INS1, and may be electrically connected to the first or second end portions EP1 or EP2 of adjacent light emitting elements LD through each contact electrode CNE.

In addition, any electrode (for example, one of the first, second, seventh, and eighth electrodes ELT1, ELT2, ELT7, and ELT8) disposed in the first emission area SEA1, and any electrode (for example, one of the third to sixth electrodes ELT3 to ELT6) disposed in the second emission area SEA2 may be electrically connected to each other by at least one contact electrode CNE. To this end, in an embodiment, each pixel PXL may include the first to fifth contact electrodes CNE1 to CNE5 for electrically connecting electrodes (e.g., predetermined electrodes) positioned in the first and second emission areas SEA1 and SEA2 to each other.

The first contact electrode CNE1 may be disposed on the first light emitting elements LD1 (in particular, the first end portions EP1) and the first electrode ELT1 of the first serial stage, and may electrically connect the first end portions EP1 of the first light emitting elements LD1 to the first electrode ELT1.

The second contact electrode CNE2 may be disposed on the first light emitting elements LD1 (in particular, the second end portions EP2) and the second electrode ELT2 of the first serial stage, and may electrically connect the second end portions EP2 of the first light emitting elements LD1 to the second electrode ELT2. In addition, the second contact electrode CNE2 may be disposed on the second light emitting elements LD2 (in particular, the first end portions EP1) and the third electrode ELT3 of the second serial stage, and may electrically connect the first end portions EP1 of the second light emitting element LD2 to the third electrode ELT3. To this end, the second contact electrode CNE2 may extend from the first emission area SEA1 to the second emission area SEA2 via the non-emission area NEA. However, in another embodiment, the second contact electrode CNE2 may be configured of a plurality of division type electrodes, and the division type electrodes may be electrically connected to each other through a bridge pattern or the like.

The third contact electrode CNE3 may be disposed on the second light emitting elements LD2 (in particular, the second end portions EP2) and the fourth electrode ELT4 of the second serial stage, and may electrically connect the second end portions EP2 of the second light emitting elements LD2 to the fourth electrode ELT4. In addition, the third contact electrode CNE3 may be disposed on the third light emitting elements LD3 (in particular, the first end portions EP1) and the fifth electrode ELT5 of the third serial stage, and may electrically connect the first end portions EP1 of the third light emitting element LD3 to the fifth electrode ELT5. However, in another embodiment, the third contact electrode CNE3 may be configured of a plurality of division type electrodes, and the division type electrodes may be electrically connected to each other through a bridge pattern or the like.

The fourth contact electrode CNE4 may be disposed on the third light emitting elements LD3 (in particular, the second end portions EP2) and the sixth electrode ELT6 of the third serial stage, and may electrically connect the second end portions EP2 of the third light emitting elements LD3 to the sixth electrode ELT6. In addition, the fourth contact electrode CNE4 may be disposed on the fourth light emitting elements LD4 (in particular, the first end portions EP1) and the seventh electrode ELT7 of the fourth serial stage, and may electrically connect the first end portions EP1 of the fourth light emitting element LD4 to the seventh electrode ELT7. To this end, the fourth contact electrode CNE4 may extend from the second emission area SEA2 to the first emission area SEA1 via the non-emission area NEA. However, in another embodiment, the fourth contact electrode CNE4 may be configured of a plurality of division type electrodes, and the division type electrodes may be electrically connected to each other through a bridge pattern or the like.

The fifth contact electrode CNE5 may be disposed on the fourth light emitting elements LD4 (in particular, the second end portions EP2) and the eighth electrode ELT8 of the fourth serial stage, and may electrically connect the second end portions EP2 of the fourth light emitting elements LD4 to the eighth electrode ELT8.

In an embodiment, at least one insulating layer may be interposed between each contact electrode CNE and the pixel electrode ELT, and each contact electrode CNE and the pixel electrode ELT corresponding thereto may be electrically connected to each other through a contact hole formed in the insulating layer. However, an electrical connection structure between the contact electrode CNE and the pixel electrode ELT may be variously changed according to an embodiment.

According to the above-described embodiment, the pixel electrodes ELT may be electrically connected in a desired shape using the contact electrodes CNE. For example, each of the first light emitting elements LD1 disposed on one side of the first emission area SEA1, the second light emitting elements LD2 disposed on one side of the second emission area SEA2, the third light emitting elements LD3 disposed on another side of the second emission area SEA2, and the fourth light emitting elements LD4 disposed on another side of the first emission area SEA1 may be sequentially connected in series.

In an embodiment, each of the pixels PXL may further include a bank BNK disposed at an edge of the pixel area PXA. The bank BNK may be a structure defining an emission area of each pixel PXL, and may be disposed at a boundary between adjacent pixel areas PXA. The bank BNK may be, for example, a pixel defining layer. The bank BNK may be configured to include at least one light blocking and/or reflective material to prevent or substantially prevent light leakage between the adjacent pixel areas PXA. For example, the bank BNK may include at least one black matrix material (for example, at least one currently known light blocking material) among various types of black matrix materials, a color filter material of a specific color, and/or the like. For example, the bank BNK may be formed in a black opaque pattern capable of blocking transmission of light.

The bank BNK may be disposed around (e.g., to surround) the emission area SEA and the non-emission area NEA. In an embodiment, the bank BNK may include a first bank opening OPNb1 exposing the entire emission area SEA and non-emission area NEA. That is, the emission area SEA and the non-emission area NEA may be directly adjacent to each other, and the bank BNK may be disposed around (e.g., to surround) the entire edge including the emission area SEA and the non-emission area NEA. In an embodiment, in addition to the first bank opening OPNb1 exposing the emission area SEA and the non-emission area NEA of each pixel PXL, the bank BNK may further include a second bank opening OPNb2 corresponding to an upper area and/or a lower area of each pixel area PXA.

In an embodiment, as the bank BNK is disposed around (e.g., to surround) the entire emission area SEA and non-emission area NEA, and is omitted in the non-emission area NEA in the pixel area PXA, the area of the emission area of the pixel PXL may be maximized or increased. However, in this case, the light emitting elements LD may be supplied to the non-emission area NEA in addition to the emission area SEA to which the light emitting elements LD are to be supplied, and when circuit conductive layers CP1 and CP2 (see FIG. 12) are present in the non-emission area NEA, the light emitting elements LD may be abnormally aligned in the non-emission area NEA due to signal interference of the circuit conductive layers CP1 and CP2. Accordingly, in the display device according to an embodiment, the light emitting elements LD may be prevented or substantially prevented from being abnormally aligned in the non-emission area NEA, by forming the barrier pattern BP in the non-emission area NEA.

The barrier pattern BP may be disposed to be adjacent to at least one of the first to eighth electrodes ELT1 to ELT8 in the non-emission area NEA. In this case, even though the circuit conductive layers CP1 and CP2 (see FIG. 12) are present in the non-emission area NEA, since the signal interference of the first and second circuit conductive layers CP1 and CP2 for the first to eighth electrodes ELT1 to ELT8 (or alignment lines) may be blocked by the barrier pattern BP in the alignment step of the light emitting element LD, the light emitting elements LD may be prevented or substantially prevented from being abnormally aligned in the non-emission area NEA.

In an embodiment, the barrier pattern BP may be integrally formed with the above-described bank pattern BNP. For example, as shown in FIG. 7, the barrier pattern BP may extend from the bank pattern BNP and may be disposed in the non-emission area NEA. One end of the barrier pattern BP may be connected to the bank pattern BNP in the first emission area SEA1, and another end of the barrier pattern BP may be connected to the bank pattern BNP in the second emission area SEA2. In an embodiment, the barrier pattern BP may include a same material as the bank pattern BNP. For example, the barrier pattern BP may be concurrently (e.g., simultaneously) formed by a same process as the bank pattern BNP. Accordingly, a number of masks may be reduced, cost may be reduced, and a manufacturing process may be simplified.

In another embodiment, the barrier pattern BP may be formed separately from the bank pattern BNP. For example, as shown in FIG. 8, the barrier pattern BP may be separated from the bank pattern BNP and may be spaced apart from the bank pattern BNP in the second direction (Y-axis direction). In an embodiment, the barrier pattern BP and the bank pattern BNP may be separated based on an edge of the non-emission area NEA. In this case, the barrier pattern BP may include a same material as the bank pattern BNP, but is not limited thereto. A further detailed description of the barrier pattern BP is provided later with reference to FIGS. 12 to 14.

Figure 9:
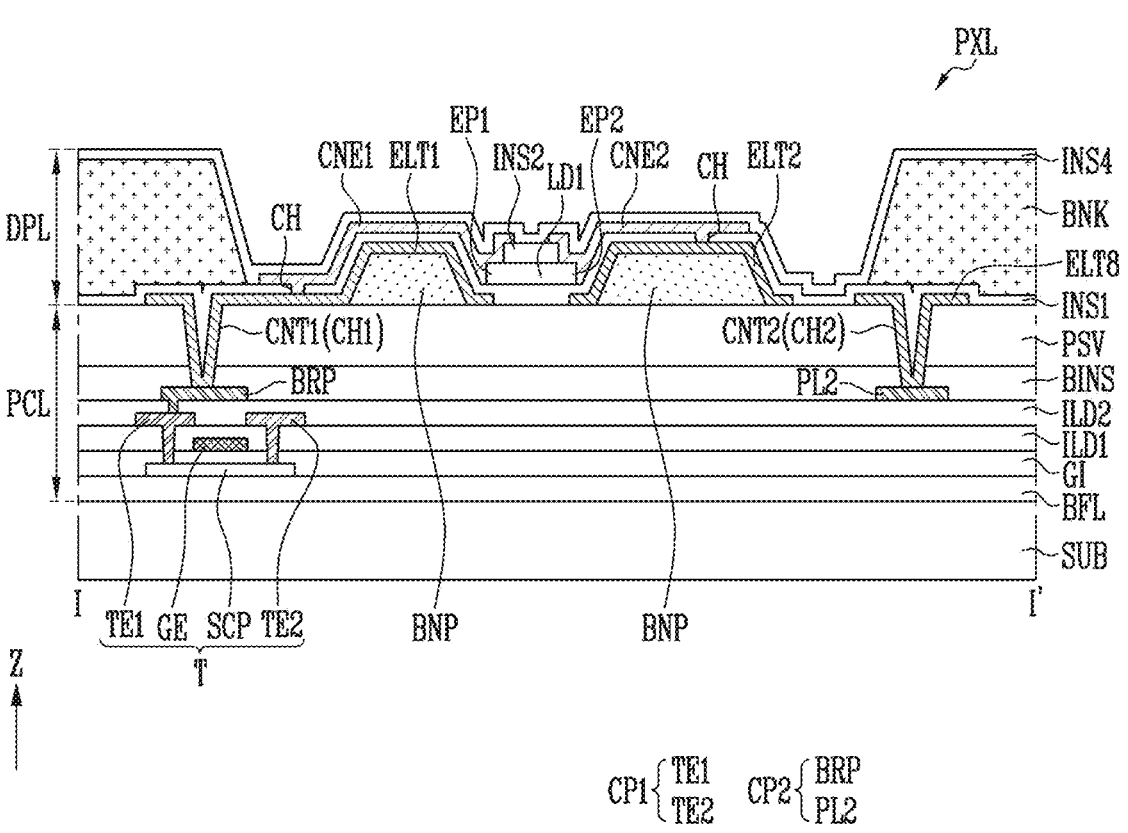
FIGS. 9 and 10 are cross-sectional views taken along a line I-I' of FIG. 7.
Figure 10:
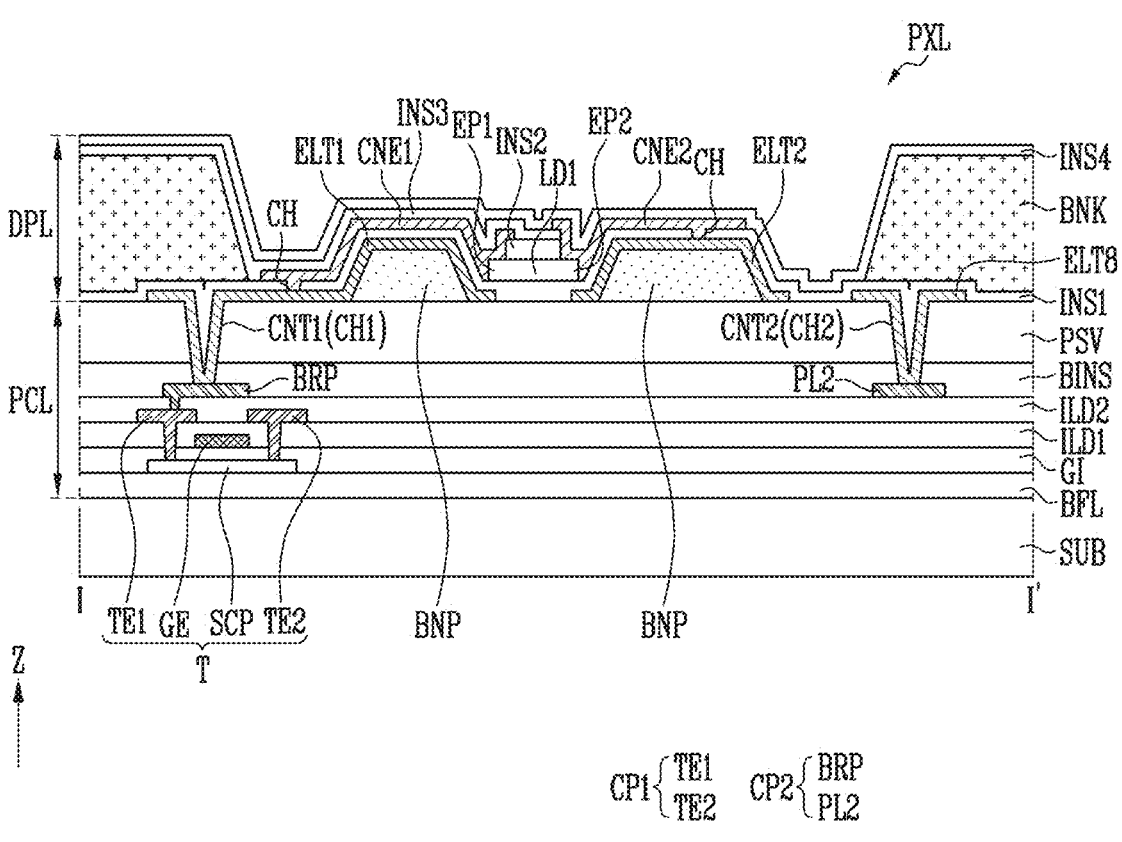

FIGS. 9 and 10 are cross-sectional views taken along a line I-I' of FIG. 7.

FIGS. 9 and 10 shows an arbitrary transistor T (for example, a transistor electrically connected to the first electrode ELT1 through the first contact portion CNT1 and a bridge pattern BRP) and the second power line PL2 electrically connected to the eighth electrode ELT8 through the second contact portion CNT2, as an example of circuit elements that may be disposed in a circuit layer PCL.

Referring to FIGS. 9 and 10, the pixel PXL and the display device including the same according to an embodiment may include the circuit layer PCL and a display layer DPL disposed on a surface of the substrate SUB.

In the circuit layer PCL, the circuit conductive layers CP1 and CP2 including the transistors T configuring the pixel circuit PXC and various lines electrically connected thereto may be disposed. In each pixel area PXA of the display layer DPL, the pixel electrodes ELT, the light emitting elements LD, and/or the contact electrodes CNE configuring the light source unit LSU of the corresponding pixel PXL may be disposed.

In an embodiment, a buffer layer BFL may be disposed on a surface of the substrate SUB. The buffer layer BFL may prevent or substantially prevent an impurity from being diffused into each circuit element.

A semiconductor layer may be disposed on the buffer layer BFL. The semiconductor layer may include a semiconductor pattern SCP of each transistor T. The semiconductor pattern SCP may include a channel region overlapping a gate electrode GE and first and second conductive regions (for example, source and drain regions) disposed on both sides of the channel region.

A gate insulating layer GI may be disposed on the semiconductor layer. The gate insulating layer GI may be configured as a single layer or multiple layers, and may include any of various types of organic/inorganic insulating materials including silicon nitride (SiNx), silicon oxide (SiOx), silicon oxynitride (SiOxNy), or the like.

A gate conductive layer may be disposed on the gate insulating layer GI. The gate conductive layer may include the gate electrode GE of each transistor T. The gate electrode GE may be disposed to overlap the semiconductor pattern SCP with the gate insulating layer GI interposed therebetween.

A first interlayer insulating layer ILD1 may be disposed on the gate conductive layer. The first interlayer insulating layer ILD1 may be configured as a single layer or multiple layers, and may include at least one inorganic insulating material and/or organic insulating material. For example, the first interlayer insulating layer ILD1 may include any of various types of organic/inorganic insulating materials including silicon nitride (SiNx), silicon oxide (SiOx), silicon oxynitride (SiOxNy), or the like, and a material configuring the first interlayer insulating layer ILD1 is not particularly limited.

The first circuit conductive layer CP1 may be disposed on the first interlayer insulating layer ILD1. The first circuit conductive layer CP1 may include first and second transistor electrodes TE1 and TE2 of each transistor T. Here, the first and second transistor electrodes TE1 and TE2 may be source electrodes or drain electrodes, respectively.

A second interlayer insulating layer ILD2 may be disposed on the first circuit conductive layer CP1. The second interlayer insulating layer ILD2 may be configured as a single layer or multiple layers, and may include at least one inorganic insulating material and/or organic insulating material. For example, the second interlayer insulating layer ILD2 may include any of various types of organic/inorganic insulating materials including silicon nitride (SiNx), silicon oxide (SiOx), silicon oxynitride (SiOxNy), or the like, but is not limited thereto.

The second circuit conductive layer CP2 may be disposed on the second interlayer insulating layer ILD2. The second circuit conductive layer CP2 may include the bridge pattern BRP electrically connecting the circuit layer PCL and the display layer DPL and/or a predetermined line (for example, the first power line PL1 and/or the second power line PL2). The bridge pattern BRP may be electrically connected to a first pixel electrode (for example, the first electrode ELT1) of each light source unit LSU through a first contact hole CH1 or the like formed in the first contact portion CNT1. The second power line PL2 may be electrically connected to the last pixel electrode (for example, the eighth electrode ELT8) of each light source unit LSU through a second contact hole CH2 or the like formed in the second contact portion CNT2.

A barrier insulating layer BINS may be disposed on the second circuit conductive layer CP2. The barrier insulating layer BINS may be configured as a single layer or multiple layers, and may include at least one inorganic insulating material and/or organic insulating material. For example, the barrier insulating layer BINS may include any of various types of organic/inorganic insulating materials, such as silicon nitride (SiNx), silicon oxide (SiOx), or silicon oxynitride (SiOxNy), but is not limited thereto.

Figure 11:
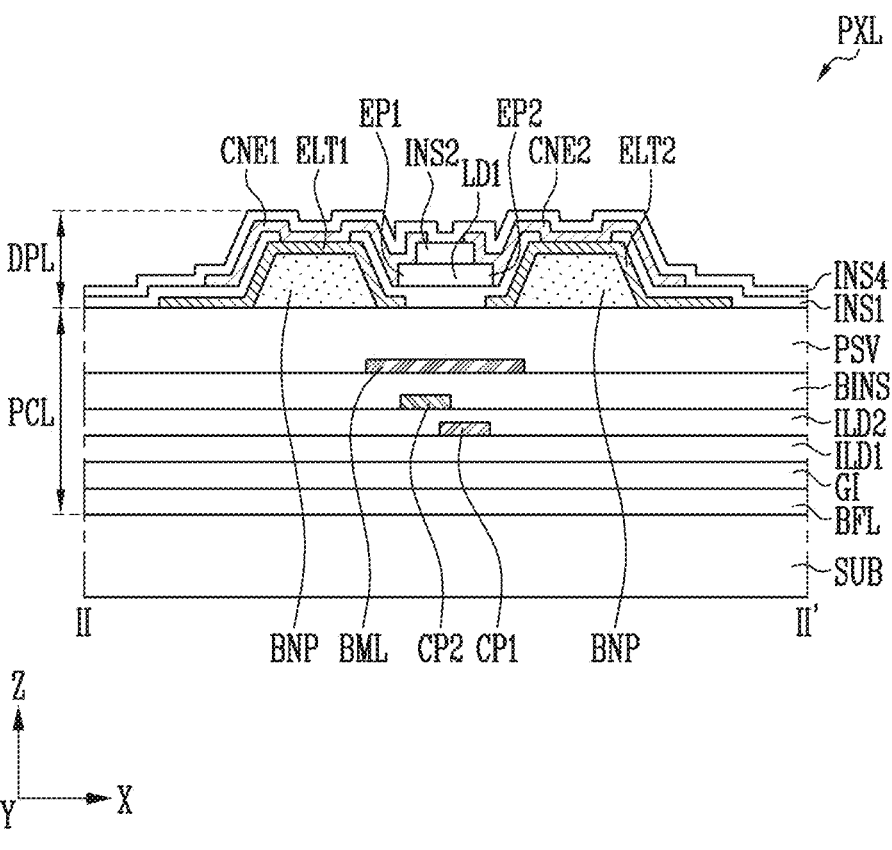
FIG. 11 is a cross-sectional view taken along a line II-II' of FIG. 7.

When the first and second circuit conductive layers CP1 and CP2 are adjacent to the first and second electrodes ELT1 and ELT2 of the display layer DPL, the light emitting elements LD may be abnormally aligned due to the signal interference of the first and second circuit conductive layers CP1 and CP2. Accordingly, the display device according to an embodiment may form a barrier metal layer BML (see FIG. 11) on the first and second circuit conductive layers CP1 and CP2 to block the signal interference due to the first and second circuit conductive layers CP1 and CP2, thereby improving the alignment degree of the light emitting element LD. FIG. 11 is referred to for a further detailed description thereof.

FIG. 11 is a cross-sectional view taken along a line II-II' of FIG. 7.

Referring to FIG. 11, the barrier metal layer BML may be disposed on the first and second circuit conductive layers CP1 and CP2. The barrier metal layer BML may block the signal interference of the first and second circuit conductive layers CP1 and CP2 in the alignment step of the light emitting element LD. To this end, the barrier metal layer BML may be electrically separated from the first and second circuit conductive layers CP1 and CP2. The barrier metal layer BML may be in a floating state, but is not limited thereto. For example, the barrier metal layer BML may be electrically connected to the first electrode ELT1 or the second electrode ELT2 after the light emitting element LD is aligned according to an embodiment.

In an embodiment, the first circuit conductive layer CP1 and/or the second circuit conductive layer CP2 may be disposed between the first electrode ELT1 and the second electrode ELT2. In this case, the first circuit conductive layer CP1 and/or the second circuit conductive layer CP2 may overlap the light emitting element LD in the third direction (Z-axis direction). In order to effectively block the signal interference of the first and second circuit conductive layers CP1 and CP2, the barrier metal layer BML may be disposed to overlap the first and second circuit conductive layers CP1 and CP2 in the third direction (Z-axis direction). For example, the barrier metal layer BML may be disposed to cover the first and second circuit conductive layers CP1 and CP2 on the barrier insulating layer BINS. In an embodiment, the barrier metal layer BML may be disposed to completely overlap the first and second circuit conductive layers CP1 and CP2 in the third direction (Z-axis direction), but is not limited thereto. According to an embodiment, the barrier metal layer BML may be disposed between the first electrode ELT1 and the second electrode ELT2. In this case, the barrier metal layer BML may overlap the light emitting element LD in the third direction (Z-axis direction), but is not limited thereto.

A passivation layer PSV may be disposed on the barrier metal layer BML. According to an embodiment, the passivation layer PSV may include at least an organic insulating layer and may substantially planarize a surface of the circuit layer PCL. The display layer DPL may be disposed on the passivation layer PSV.

The display layer DPL may include the plurality of pixel electrodes ELT (for example, the first to eighth electrodes ELT1 to ELT8) disposed in the emission areas SEA of each pixel PXL, the plurality of light emitting elements LD connected in series, parallel, or series/parallel between the pixel electrodes ELT, and the plurality of contact electrodes CNE electrically connecting the pixel electrodes ELT and the light emitting elements LD.

Each of FIGS. 9 to 11 shows one light emitting element LD, but as shown in FIG. 6, the pixel PXL may include the plurality of light emitting elements LD connected in a forward direction between the first and last pixel electrodes (for example, the first and eighth electrodes ELT1 and ELT8). Therefore, each embodiment is described below assuming that the pixel PXL includes the plurality of light emitting elements LD.

In an embodiment, the display layer DPL may include the bank pattern BNP of a separate or integral type for protruding one area of each of the pixel electrodes ELT upward, that is, in the third direction (Z-axis direction), and/or the bank BNK around (e.g., surrounding) the pixel area PXA.

The bank pattern BNP may be disposed on the circuit layer PCL. The bank pattern BNP may be formed as a separate or integral type of pattern. The bank pattern BNP may protrude upward (for example, in the third direction (Z-axis direction)) on a surface of the substrate SUB. Accordingly, an area of the pixel electrode ELT disposed on each bank pattern BNP may protrude upward.

The reflective partition wall may be formed around the light emitting elements LD by the bank pattern BNP and the pixel electrodes ELT disposed thereon. For example, when the pixel electrodes ELT include at least a reflective electrode layer, light emitted from both ends of the light emitting elements LD may be reflected from the reflective electrode layer, and may be emitted to an upper direction (for example, the third direction (Z-axis direction)) of each pixel PXL.

The bank pattern BNP may have any of various shapes. In an embodiment, the bank pattern BNP may be formed to have an inclined surface inclined at an angle of a range (e.g., a predetermined range) with respect to the substrate SUB as shown in FIGS. 9 to 11. In another embodiment, the bank pattern BNP may have sidewalls of a curved surface shape, a step shape, or the like. For example, the bank pattern BNP may have a cross-section of a semicircle shape, a semi-ellipse shape, or the like.

The electrodes and/or the insulating layers disposed on the bank pattern BNP may have a shape corresponding to the bank pattern BNP. For example, each pixel electrode ELT may include an inclined surface or a curved surface having the shape corresponding to the shape of the bank pattern BNP around the light emitting elements LD. The bank pattern BNP may be omitted according to an embodiment.

The bank pattern BNP may include an organic insulating material, such as polyacrylate resin, epoxy resin, phenolic resin, polyamide resin, polyimide resin, polyester resin, polyphenylenether resin, polyphenylenesulfide resin, or benzocyclobutene (BCB). However, the disclosure is not limited thereto, and the bank pattern BNP may include an inorganic insulating material, such as any of silicon oxide (SiOx), silicon nitride (SiNx), silicon oxynitride (SiOxNy), hafnium oxide (HfOx), aluminum oxide (AlOx), and titanium oxide (TiOx), or may be formed of an organic/inorganic composite layer.

The pixel electrodes ELT of each pixel PXL may be disposed on the bank pattern BNP. One of the pixel electrodes ELT, for example, the first electrode ELT1 may be electrically connected to the bridge pattern BRP through the first contact portion CNT1 (or the first contact hole CH1) passing through the barrier insulating layer BINS and the passivation layer PSV. Another one of the pixel electrodes ELT, for example, the eighth electrode ELT8 may be electrically connected to the second power line PL2 through the second contact portion CNT2 (or the second contact hole CH2) passing through the barrier insulating layer BINS and the passivation layer PSV.

Each pixel electrode ELT may include at least one conductive material. For example, each pixel electrode ELT may include at least one conductive material, such as any of at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), an alloy including the same, a conductive oxide, such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), or a fluorine tin oxide (FTO), and a conductive polymer such as PEDOT, but is not limited thereto.

The first insulating layer INS1 may be disposed on the pixel electrodes ELT. In an embodiment, the first insulating layer INS1 may be formed to firstly cover the first and second electrodes ELT1 and ELT2 entirely. As described above, since the pixel electrodes ELT are formed and then covered by the first insulating layer INS1 or the like, the pixel electrodes ELT may be prevented or substantially prevented from being damaged in a subsequent process. After the light emitting elements LD are supplied and aligned, the first insulating layer INS1 may be partially opened to expose an area of the pixel electrodes ELT.

The bank BNK may be disposed on the first insulating layer INS1. However, a position on a cross-section of the bank BNK is not limited thereto, and the bank BNK may be disposed on a same layer as the above-described bank pattern BNP. The light emitting elements LD may be supplied and aligned in the emission area SEA positioned in the bank BNK. The light emitting elements LD may be supplied to the emission area SEA of each pixel PXL through an inkjet method, a slit coating method, or other various methods, and the light emitting elements LD may be aligned between the pixel electrodes ELT by applying an alignment signal (e.g., a predetermined alignment signal) (or alignment voltage).

In an embodiment, the bank BNK may include an organic insulating material, such as polyacrylate resin, epoxy resin, phenolic resin, polyamide resin, polyimide resin, polyester resin, polyphenylenether resin, polyphenylenesulfide resin, or benzocyclobutene (BCB). However, the disclosure is not limited thereto, and the bank BNK may include an inorganic insulating material, such as any of silicon oxide (SiOx), silicon nitride (SiNx), silicon oxynitride (SiOxNy), hafnium oxide (HfOx), aluminum oxide (AlOx), and titanium oxide (TiOx), or may be formed of an organic/inorganic composite layer.

In an embodiment, at least some of the light emitting elements LD may be disposed between a pair of pixel electrodes ELT so as to overlap or so as not to overlap the pair of pixel electrodes ELT adjacent to both end portions (that is, the first and second end portions EP1 and EP2) in a longitudinal direction. In addition, the end portions (that is, the first and second end portions EP1 and EP2) of the light emitting elements LD may be in direct contact with each pixel electrode ELT or may be electrically connected to the pixel electrode ELT through the contact electrode CNE.

A second insulating layer INS2 may be disposed on an area of the light emitting elements LD. The second insulating layer INS2 may be locally disposed on an area of each of the light emitting elements LD to expose the first and second end portions EP1 and EP2 of each of the light emitting elements LD. When the second insulating layer INS2 is formed on the light emitting elements LD after the alignment of the light emitting elements LD is completed, the light emitting elements LD may be prevented or substantially prevented from being deviated from an aligned position.

Figure 12:
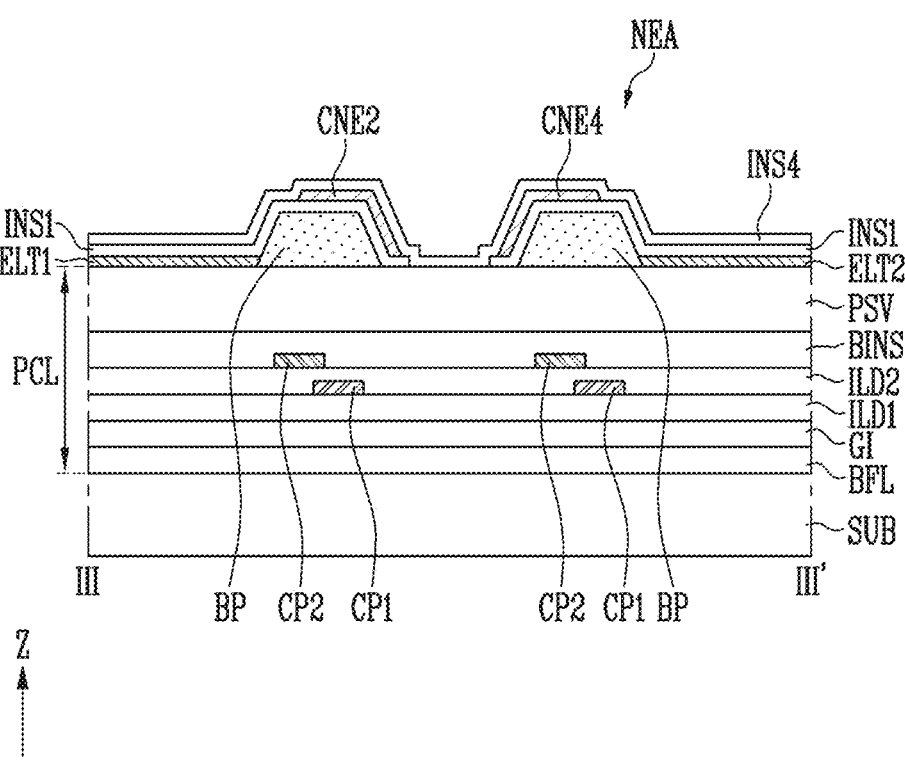
FIGS. 12 and 13 are cross-sectional views taken along a line III-III' of FIG. 7.
Figure 13:
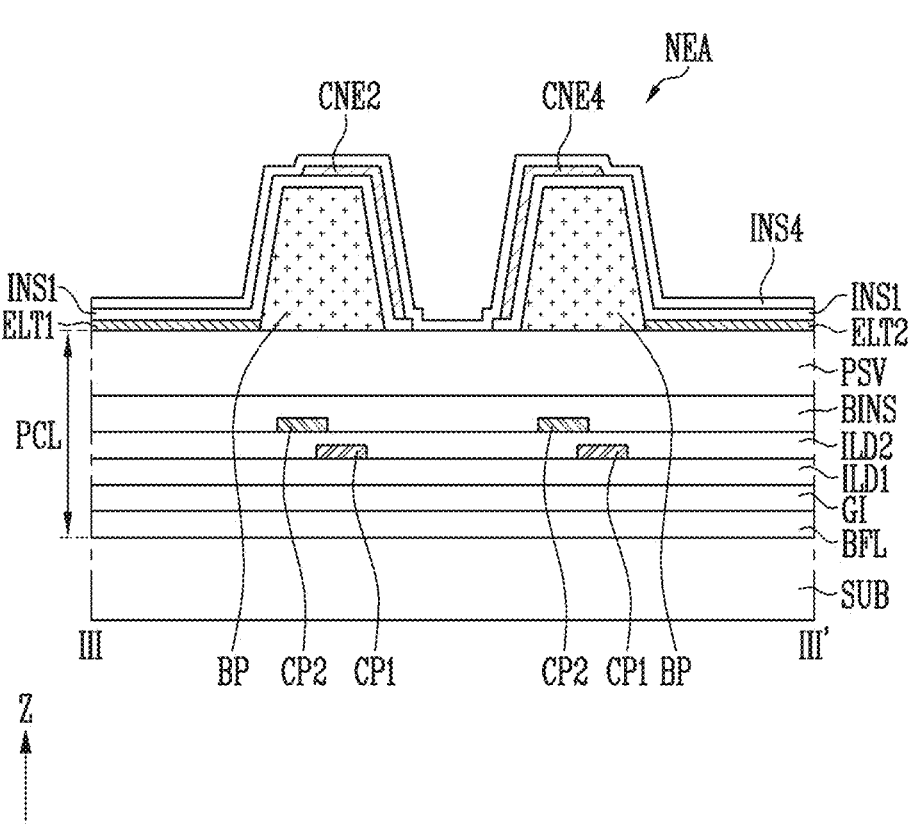
Figure 14:
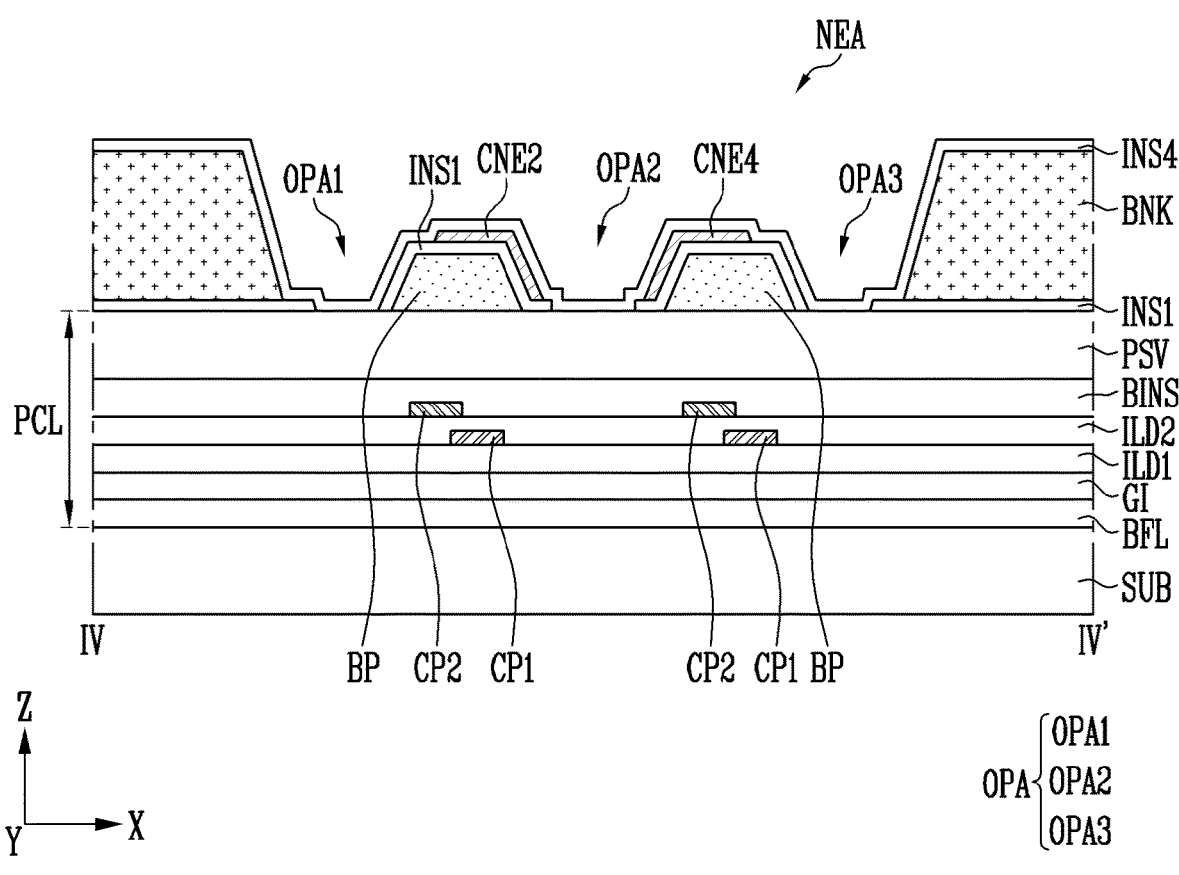
FIG. 14 is a cross-sectional view taken along a line IV-IV' of FIG. 7.

As described above, in a process of supplying the light emitting elements LD into the emission area SEA, the light emitting elements LD may be supplied to the non-emission area NEA, and when the circuit conductive layers CP1 and CP2 (see FIG. 12) are present in the non-emission area NEA, the light emitting elements LD may be abnormally aligned in the non-emission area NEA due to the signal interference of the circuit conductive layers CP1 and CP2. Accordingly, in the display device according to an embodiment, the light emitting elements LD may be prevented or substantially prevented from being abnormally aligned in the non-emission area NEA, by forming the barrier pattern BP in the non-emission area NEA. FIGS. 12 to 14 are referred to for a further detailed description thereof.

FIGS. 12 and 13 are cross-sectional views taken along a line III-III' of FIG. 7. FIG. 14 is a cross-sectional view taken along a line IV-IV' of FIG. 7.

Referring to FIGS. 12 and 13, the barrier pattern BP may be disposed on the first and second circuit conductive layers CP1 and CP2 in the non-emission area NEA. The barrier pattern BP may block the signal interference of the first and second circuit conductive layers CP1 and CP2 in the alignment step of the light emitting element LD.

In an embodiment, the barrier pattern BP may be disposed to overlap the first circuit conductive layer CP1 and/or the second circuit conductive layer CP2 in the third direction (Z-axis direction) in the non-emission area NEA. For example, the barrier pattern BP may be disposed to cover the first and second circuit conductive layers CP1 and CP2. In an embodiment, the barrier pattern BP may be disposed to completely overlap the first and second circuit conductive layers CP1 and CP2 in the third direction (Z-axis direction), but is not limited thereto.

In an embodiment, the barrier pattern BP may include a same material as the above-described bank pattern BNP, as shown in FIG. 12. For example, the barrier pattern BP may be concurrently (e.g., simultaneously) formed by a same process as the bank pattern BNP. Accordingly, a number of masks may be reduced, cost may be reduced, and a manufacturing process may be simplified. In another embodiment, the barrier pattern BP may include a same material as the above-described bank BNK, as shown in FIG. 13. For example, the barrier pattern BP may be concurrently (e.g., simultaneously) formed by a same process as the bank BNK. Accordingly, a number of masks may be reduced, cost may be reduced, and a manufacturing process may be simplified.

Referring to FIG. 14, the barrier pattern BP may be disposed between the above-described openings OPA. That is, the barrier pattern BP may be disposed in a space where the openings OPA are spaced apart. For example, the barrier pattern BP may be disposed between the first opening OPA1 and the second opening OPA2. In an embodiment, the barrier pattern BP may be disposed between the second opening OPA2 and the third opening OPA3. Accordingly, the light emitting elements LD may be prevented or substantially prevented from being abnormally aligned in the non-emission area NEA while securing a space where the alignment lines may be divided into the plurality of pixel electrodes ELT in the non-emission area NEA.

Referring to FIGS. 9 and 10 again, both end portions of the light emitting elements LD, which are not covered by the second insulating layer INS2, that is, the first and second end portions EP1 and EP2, may be covered by each contact electrode CNE, and may be electrically connected to each pixel electrode ELT by the contact electrode CNE.

In an embodiment, as shown in FIG. 9, two contact electrodes CNE (for example, the first and second contact electrodes CNE1 and CNE2) facing each other with each light emitting element LD interposed therebetween may be disposed on a same layer. When the contact electrodes CNE are formed on the same layer, the contact electrodes CNE may be formed concurrently (e.g., simultaneously) in a same process. In this case, a manufacturing process of the pixel PXL and the display device including the same may be simplified. In another embodiment, as shown in FIG. 10, two contact electrodes CNE (for example, the first and second contact electrodes CNE1 and CNE2) facing each other with each light emitting element LD interposed therebetween may be disposed separately on different layers. In this case, the display layer DPL may further include a third insulating layer INS3 interposed between the contact electrodes CNE. The third insulating layer INS3 may be disposed to cover one (for example, the first contact electrode CNE1) of the pair of contact electrodes CNE. When the second insulating layer INS2 and/or the third insulating layer INS3 are formed between the pair of contact electrodes CNE, since the contact electrodes CNE may be stably separated, occurrence of a short defect between the first and second end portions EP1 and EP2 of the light emitting elements LD may be prevented or substantially prevented.

The contact electrodes CNE may be formed of any of various transparent conductive materials. For example, the contact electrodes CNE may include at least one of various transparent conductive materials including ITO, IZO, ITZO, ZnO, AZO, GZO, ZTO, GTO, and FTO, and may be implemented to be substantially transparent or translucent. Accordingly, light emitted from the light emitting elements LD through each of the first and second end portions EP1 and EP2 may pass through the contact electrodes CNE and may be emitted to the outside of the pixel PXL.

A fourth insulating layer INS4 may be disposed on the contact electrodes CNE and/or the third insulating layer INS3. For example, the fourth insulating layer INS4 may be entirely formed on the substrate SUB to cover the bank pattern BNP, the pixel electrodes ELT, the first to third insulating layers INS1, INS2, and INS3, the light emitting elements LD, the contact electrodes CNE, and/or the bank BNK. The fourth insulating layer INS4 may include at least one layer of an inorganic layer and/or an organic layer. According to an embodiment, the fourth insulating layer INS4 may include a thin film encapsulation layer of a multilayer structure. For example, the fourth insulating layer INS4 may include a thin film encapsulation layer of a multilayer structure including at least two layers of inorganic insulating layers and at least one layer of an organic insulating layer interposed between the at least two layers of inorganic insulating layers. However, a configuration, material, and/or a structure of the fourth insulating layer INS4 are not limited thereto, and, according to an embodiment, at least one layer of an overcoat layer, a filler layer, an upper substrate, and/or the like may be further disposed on the fourth insulating layer INS4.

In accordance with the display device according to the embodiment described above, since the signal interference due to the circuit conductive layers CP1 and CP2 may be minimized or reduced when aligning the light emitting element LD, by forming the barrier metal layer BML and/or the barrier pattern BP on the circuit conductive layers CP1 and CP2, the alignment degree of the light emitting element LD may be improved.

Herein, another embodiment is described. In the following embodiment, the same configurations as those previously described are referred to by the same reference numeral, and repetitive descriptions are omitted or simplified.

Figure 15:
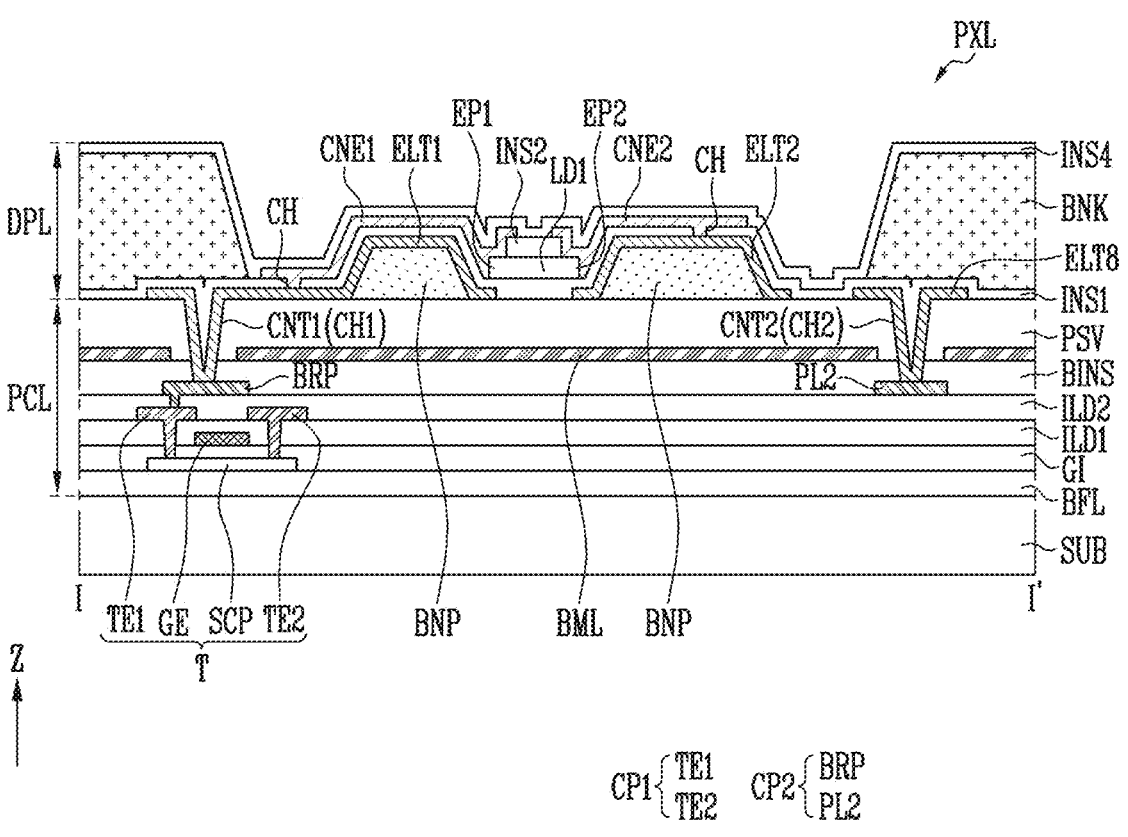
FIG. 15 is a cross-sectional view illustrating a pixel according to another embodiment.

FIG. 15 is a cross-sectional view illustrating a pixel according to another embodiment. FIG. 15 may correspond to a cross-section at substantially a same position as that of FIG. 7.

Referring to FIG. 15, a display device according to the present embodiment is different from the embodiments of FIGS. 1 to 14 in that the barrier metal layer BML is disposed on the entire surface of the substrate SUB.

The barrier metal layer BML may be disposed on the entire surface of the substrate SUB to cover the first and second circuit conductive layers CP1 and CP2 of the circuit layer PCL. The barrier metal layer BML may be disposed on the first and second circuit conductive layers CP1 and CP2 to minimize or reduce the signal interference of the first and second circuit conductive layers CP1 and CP2 in the process of aligning the light emitting element LD and may be the same as that described above.

The barrier metal layer BML may include a contact hole through which the pixel electrodes ELT and the circuit conductive layers CP1 and CP2 are electrically connected. That is, the pixel electrodes ELT may be electrically connected to the circuit conductive layers CP1 and CP2 through a contact hole passing through the barrier metal layer BML, the barrier insulating layer BINS, and the passivation layer PSV, respectively. For example, one of the pixel electrodes ELT, for example, the first electrode ELT1 may be electrically connected to the bridge pattern BRP through the first contact portion CNT1 (or the first contact hole CH1) passing through the barrier metal layer BML, the barrier insulating layer BINS, and the passivation layer PSV. Another one of the pixel electrodes ELT, for example, the eighth electrode ELT8 may be electrically connected to the second power line PL2 through the second contact portion CNT2 (or the second contact hole CH2) passing through the barrier metal layer BML, the barrier insulating layer BINS, and the passivation layer PSV. In this case, the contact hole of the barrier metal layer BML may be covered by the barrier insulating layer BINS, and, thus, the barrier metal layer BML and the circuit conductive layers CP1 and CP2 may be electrically separated. The barrier metal layer BML may be in a floating state, but is not limited thereto. For example, the barrier metal layer BML may be electrically connected to the first electrode ELT1 or the second electrode ELT2 after the light emitting element LD is aligned according to an embodiment.

Figure 16:
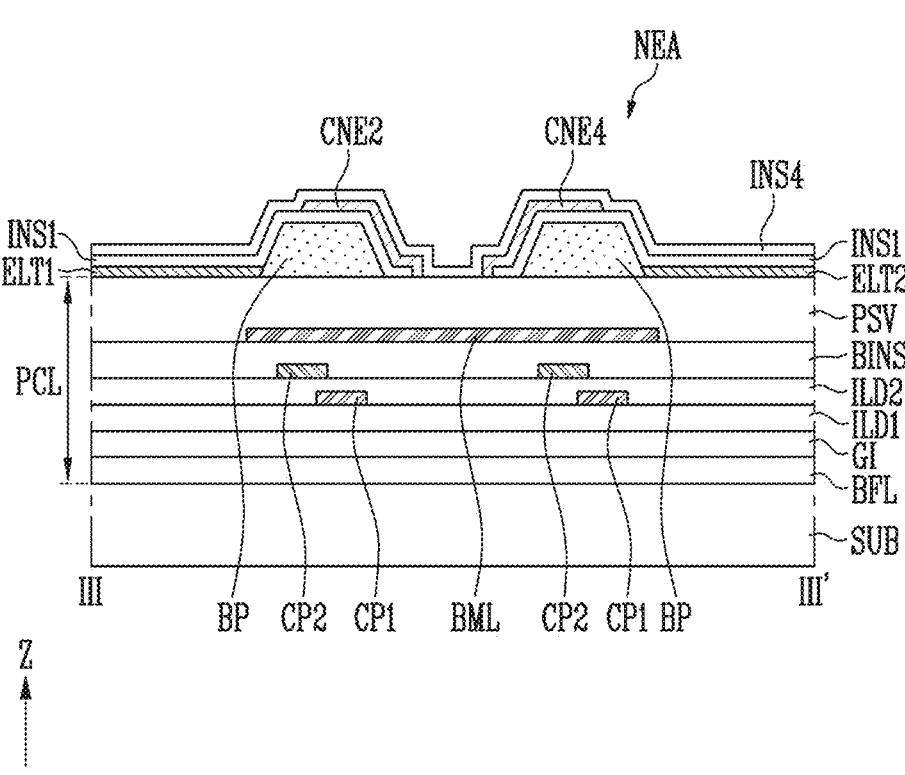
FIG. 16 is a cross-sectional view illustrating a non-emission area of a pixel according to another embodiment.

FIG. 16 is a cross-sectional view illustrating a non-emission area of a pixel according to another embodiment. FIG. 16 may correspond to a cross section at substantially a same position as that of FIG. 12.

Referring to FIG. 16, a display device according to the present embodiment is different from the embodiments of FIGS. 1 to 14 in that the barrier metal layer BML is also disposed in the non-emission area NEA.

In an embodiment, the barrier metal layer BML may be disposed on the first and second circuit conductive layers CP1 and CP2 in the non-emission area NEA. The barrier metal layer BML may block the signal interference of the first and second circuit conductive layers CP1 and CP2 in the alignment step of the light emitting element LD. In order to effectively block the signal interference of the first and second circuit conductive layers CP1 and CP2, the barrier metal layer BML may be disposed to overlap the first and second circuit conductive layers CP1 and CP2 in the third direction (Z-axis direction). For example, the barrier metal layer BML may be disposed to cover the first and second circuit conductive layers CP1 and CP2 on the barrier insulating layer BINS. In an embodiment, the barrier metal layer BML may be disposed to completely overlap the first and second circuit conductive layers CP1 and CP2 in the third direction (Z-axis direction), but is not limited thereto. In addition, the barrier metal layer BML may be disposed to overlap the barrier pattern BP in the third direction (Z-axis direction) in the non-emission area NEA. As described above, when the barrier metal layer BML is disposed in the non-emission area NEA, the signal interference of the first and second circuit conductive layers CP1 and CP2 may be blocked in the process of aligning the light emitting element LD, and, thus, the light emitting elements LD may be prevented or substantially prevented from being abnormally aligned in the non-emission area NEA.

Those skilled in the art will understand that the disclosure may be implemented in a modified form without departing from the above-described characteristics. Therefore, the disclosed components and methods should be considered in a descriptive point of view, and not a limiting point of view. The scope of the disclosure is illustrated in the claims, and all differences within the scope will be construed as being included in the disclosure.

What is claimed is:

1. A display device comprising:
a substrate comprising a plurality of pixels;
a circuit conductive layer on the substrate and comprising a first circuit conductive layer and a second circuit conductive layer over the first circuit conductive layer;
a barrier metal layer over the first and second circuit conductive layers;
a first electrode and a second electrode on the barrier metal layer and spaced apart from each other along a first direction;
a light emitting element between the first electrode and the second electrode; and
an insulating layer on the first electrode and the second electrode and arranged between the first electrode and the light emitting element and between the second electrode and the light emitting element, wherein, along the first direction, the insulating layer extends continuously between the first and second electrodes and an entire length of the light emitting element,
wherein the barrier metal layer is electrically separated from the circuit conductive layer, and
wherein the barrier metal layer overlaps the light emitting element.

2. The display device according to claim 1, wherein the circuit conductive layer overlaps the light emitting element.

3. The display device according to claim 1, further comprising a barrier insulating layer between the circuit conductive layer and the barrier metal layer.

4. The display device according to claim 3, wherein the barrier metal layer covers the circuit conductive layer and is on the barrier insulating layer.

5. The display device according to claim 3, wherein the first electrode or the second electrode is electrically connected to the circuit conductive layer through a contact hole passing through the barrier insulating layer.

6. The display device according to claim 1, wherein the first electrode or the second electrode is electrically connected to the circuit conductive layer through a contact hole passing through the barrier metal layer.

7. The display device according to claim 1, wherein each of the plurality of pixels comprises an emission area and a non-emission area.

8. The display device according to claim 7, further comprising a barrier pattern in the non-emission area.

9. The display device according to claim 8, wherein the barrier pattern comprises an organic insulating material.

10. The display device according to claim 8, further comprising a bank pattern in the emission area and overlapping the first electrode and the second electrode.

11. The display device according to claim 10, wherein the barrier pattern comprises a same material as the bank pattern.

12. The display device according to claim 8, further comprising a bank around the emission area and the non-emission area.

13. The display device according to claim 12, wherein the barrier pattern comprises a same material as the bank.

14. The display device according to claim 8, wherein the emission area comprises a first emission area and a second emission area, and the non-emission area is between the first emission area and the second emission area.

15. A display device comprising:

a substrate comprising a plurality of pixels, wherein each of the plurality of pixels comprises an emission area and a non-emission area;

a circuit conductive layer on the substrate and comprising a first circuit conductive layer and a second circuit conductive layer over the first circuit conductive layer;

a barrier metal layer over the first and second circuit conductive layers;

a first electrode and a second electrode on the barrier metal layer and spaced apart from each other;

a light emitting element between the first electrode and the second electrode;

a barrier pattern in the non-emission area; and an insulating layer covering the first electrode and the second electrode, wherein the barrier metal layer is electrically separated from the circuit conductive layer, wherein the barrier metal layer overlaps the light emitting element, and the insulating layer comprises at least one opening in the non-emission area.

16. The display device according to claim 15, wherein the at least one opening comprises a first opening at an end of the first electrode and a second opening at an end of the second electrode.

17. The display device according to claim 16, wherein the barrier pattern is between the first opening and the second opening.

* * * * *